(12) United States Patent  
Vaganov

(10) Patent No.: US 8,350,345 B2
(45) Date of Patent: Jan. 8, 2013

(54) THREE-DIMENSIONAL INPUT CONTROL DEVICE

(76) Inventor: Vladimir Vaganov, Los Gatos, CA (US)

( * ) Notice: Subject to any disclaimer, the term of this patent is extended or adjusted under 35 U.S.C. 154(b) by 0 days.

(21) Appl. No.: 13/215,057

(22) Filed: Aug. 22, 2011

(65) Prior Publication Data

US 2011/0298705 A1    Dec. 8, 2011

Related U.S. Application Data

(60) Continuation-in-part of application No. 12/477,076, filed on Jun. 2, 2009, now Pat. No. 8,004,052, which is a continuation of application No. 11/025,642, filed on Dec. 28, 2004, now Pat. No. 7,554,167, and a continuation-in-part of application No. 12/852,419, filed on Aug. 6, 2010, now Pat. No. 8,053,267, which is a division of application No. 11/649,992, filed on Jan. 4, 2007, now Pat. No. 7,772,657, which is a continuation-in-part of application No. 11/025,642, filed on Dec. 28, 2004, now Pat. No. 7,554,167.

(60) Provisional application No. 60/533,409, filed on Dec. 29, 2003, provisional application No. 60/756,200, filed on Jan. 5, 2006.

(51) Int. Cl.
    H01L 29/84   (2006.01)
    H01L 23/48   (2006.01)
    H01L 23/52   (2006.01)
    H01L 29/40   (2006.01)

(52) U.S. Cl. ........ 257/415; 257/417; 257/418; 257/419; 257/420; 257/785; 257/E23.078; 257/E27.006

(58) Field of Classification Search ............... 257/415, 257/417, 418, 419, 420, 785, E23.078, E27.006
    See application file for complete search history.

(56) References Cited

U.S. PATENT DOCUMENTS 4,615,258 A * 10/1986 Hirmann .......................... 92/40
4,680,577 A    7/1987 Straayer et al.
(Continued)

FOREIGN PATENT DOCUMENTS

JP    2007010379    1/2007

OTHER PUBLICATIONS

PCT; International Search Report from PCT/US2007/000411 mailed Oct. 4, 2007; (3 pages).

(Continued)

Primary Examiner — Ida M Soward
(74) Attorney, Agent, or Firm — Fitch, Even, Tabin & Flannery, LLP

(57) ABSTRACT

Some embodiments provide force input control devices for sensing vector forces comprising: a sensor die comprising: a rigid island, an elastic element coupled to the rigid island, die frame coupled to a periphery of the elastic element, one or more stress sensitive components on the elastic element, and signal processing IC, where the sensor die is sensitive to a magnitude and a direction of a force applied to the rigid island within the sensor die, where the sensor die is coupled electrically and mechanically to a substrate, a spring element coupling an external button, where the force is applied, to the rigid island element, wherein the spring element has a flat geometry and located in a plane parallel to a plane of the substrate, where the spring element is configured to translate a deflection of the button into an allowable force applied to the rigid island.

20 Claims, 19 Drawing Sheets

U.S. PATENT DOCUMENTS

| | | | |
|---|---|---|---|
| 4,840,060 A * | 6/1989 | Notz et al. | 73/114.48 |
| 4,891,985 A | 1/1990 | Glenn | |
| 4,951,510 A | 8/1990 | Holm-Kennedy et al. | |
| 4,967,605 A | 11/1990 | Okada | |
| 5,035,148 A | 7/1991 | Okada | |
| 5,263,375 A | 11/1993 | Okada | |
| 5,278,557 A | 1/1994 | Stokes et al. | |
| 5,489,900 A | 2/1996 | Cali et al. | |
| 5,499,041 A | 3/1996 | Brandenburg et al. | |
| 5,600,074 A | 2/1997 | Marek et al. | |
| 5,604,314 A * | 2/1997 | Grahn | 73/628 |
| 5,640,178 A | 6/1997 | Endo et al. | |
| 5,682,000 A | 10/1997 | Okada | |
| 5,703,393 A | 12/1997 | Yamaguchi | |
| 5,760,313 A | 6/1998 | Guentner | |
| 6,121,954 A | 9/2000 | Seffernick | |
| 6,185,814 B1 | 2/2001 | Okada | |
| 6,195,082 B1 | 2/2001 | May et al. | |
| 6,211,558 B1 | 4/2001 | Ismail et al. | |
| 6,369,435 B1 | 4/2002 | Igel | |
| 6,373,265 B1 | 4/2002 | Morimoto et al. | |
| 6,388,299 B1 | 5/2002 | Kang et al. | |
| 6,441,503 B1 | 8/2002 | Webster | |
| 6,477,903 B2 | 11/2002 | Okada | |
| 6,518,954 B1 | 2/2003 | Chen | |
| 6,523,423 B1 | 2/2003 | Namerikawa et al. | |
| 6,530,283 B2 | 3/2003 | Okada et al. | |
| 6,534,711 B1 | 3/2003 | Pollack | |
| 6,570,556 B1 | 5/2003 | Liao et al. | |
| 6,642,857 B1 | 11/2003 | Schediwy et al. | |
| 6,654,004 B2 | 11/2003 | Hoggarth | |
| 6,654,005 B2 | 11/2003 | Wang | |
| 6,697,049 B2 | 2/2004 | Lu | |
| 6,707,445 B1 | 3/2004 | Hasemann | |
| 6,750,408 B2 | 6/2004 | Inoue et al. | |
| 6,753,850 B2 | 6/2004 | Poole | |
| 6,771,992 B1 | 8/2004 | Tomura et al. | |
| 6,774,887 B2 | 8/2004 | Lu | |
| 6,787,865 B2 | 9/2004 | Endo et al. | |
| 6,788,291 B2 | 9/2004 | Burry | |
| 6,791,532 B2 | 9/2004 | Hirano et al. | |
| 6,809,529 B2 | 10/2004 | Okada et al. | |
| 6,809,721 B2 | 10/2004 | Love | |
| 6,859,048 B2 | 2/2005 | Okada et al. | |
| 6,903,724 B2 | 6/2005 | Grivas et al. | |
| 6,920,041 B2 | 7/2005 | Oross et al. | |
| 6,940,495 B2 | 9/2005 | Morimoto et al. | |
| 6,950,092 B2 | 9/2005 | Buss | |
| 6,952,197 B1 | 10/2005 | Nakamura et al. | |
| 7,123,028 B2 | 10/2006 | Okada et al. | |
| 7,123,240 B2 | 10/2006 | Kemppinen | |
| 7,242,273 B2 * | 7/2007 | Isobe et al. | 335/78 |
| 7,262,071 B2 | 8/2007 | Larmer et al. | |
| 7,273,767 B2 | 9/2007 | Ong et al. | |
| 7,367,232 B2 | 5/2008 | Vaganov et al. | |
| 7,441,470 B2 | 10/2008 | Morimoto | |
| 7,448,861 B2 * | 11/2008 | Koike et al. | 425/116 |
| 7,453,085 B2 * | 11/2008 | Chang et al. | 257/41 |
| 7,476,952 B2 | 1/2009 | Vaganov et al. | |
| 7,554,167 B2 | 6/2009 | Vaganov | |
| 7,657,128 B2 * | 2/2010 | Silverbrook et al. | 382/313 |
| 7,772,657 B2 | 8/2010 | Vaganov | |
| 7,880,247 B2 | 2/2011 | Vaganov et al. | |
| 7,898,532 B2 * | 3/2011 | Lapstun et al. | 345/179 |
| 7,928,967 B2 * | 4/2011 | Underwood et al. | 345/179 |
| 8,004,052 B2 | 8/2011 | Vaganov | |
| 8,053,267 B2 | 11/2011 | Vaganov | |
| 2001/0000125 A1 | 4/2001 | Zimmerman et al. | |
| 2001/0003326 A1 | 6/2001 | Okada et al. | |
| 2002/0075234 A1 | 6/2002 | Poole | |
| 2002/0149564 A1 | 10/2002 | Simpson et al. | |
| 2002/0151282 A1 | 10/2002 | Wang | |
| 2002/0190949 A1 | 12/2002 | Hirano et al. | |
| 2003/0030452 A1 | 2/2003 | Okada | |
| 2003/0052861 A1 | 3/2003 | Peng | |
| 2003/0076302 A1 | 4/2003 | Langstraat | |
| 2003/0094663 A1 | 5/2003 | Sato et al. | |
| 2003/0105076 A1 | 6/2003 | Ansari et al. | |
| 2003/0105576 A1 | 6/2003 | Kamiya et al. | |
| 2004/0027331 A1 | 2/2004 | Mochizuki et al. | |
| 2004/0102858 A1 * | 5/2004 | Kesil et al. | 700/11 |
| 2004/0222968 A1 | 11/2004 | Endo | |
| 2004/0227732 A1 | 11/2004 | Kemppinen | |
| 2005/0160814 A1 | 7/2005 | Vaganov et al. | |
| 2005/0161489 A1 | 7/2005 | Pikulski | |
| 2005/0170544 A1 | 8/2005 | Chang et al. | |
| 2005/0178214 A1 | 8/2005 | Okada et al. | |
| 2005/0190152 A1 | 9/2005 | Vaganov | |
| 2005/0190159 A1 | 9/2005 | Skarine | |
| 2005/0217386 A1 | 10/2005 | Hirose et al. | |
| 2006/0022940 A1 | 2/2006 | Armstrong | |
| 2006/0220803 A1 * | 10/2006 | Kranz et al. | 340/426.24 |
| 2007/0000335 A1 | 1/2007 | Morimoto | |
| 2007/0245836 A1 | 10/2007 | Vaganov | |
| 2007/0264743 A1 | 11/2007 | Vaganov et al. | |
| 2008/0105936 A1 | 5/2008 | Nakamura | |
| 2009/0237275 A1 | 9/2009 | Vaganov | |
| 2009/0259412 A1 * | 10/2009 | Brogardh | 702/41 |
| 2010/0252897 A1 * | 10/2010 | Seeger et al. | 257/415 |
| 2010/0317139 A1 | 12/2010 | Vaganov et al. | |

OTHER PUBLICATIONS

PCT; International Search Report and Written Opinion of the International Searching Authority for PCT/US2007/11988 mailed Jul. 28, 2008; (11 pages).

USPTO; Non-Final Office Action mailed Aug. 28, 2008; U.S. Appl. No. 11/025,642; (6 pages).

USPTO; Notice of Allowance mailed Sep. 4, 2008; U.S. Appl. No. 11/804,954; (8 pages).

USPTO; Notice of Allowance mailed Feb. 23, 2009; U.S. Appl. No. 11/025,642; (7 pages).

Austrian Patent Office; Written Opinion by the Austrian Patent Office mailed Sep. 29, 2009; Application No. 200800396-4;(4 Pages).

USPTO; Non-Final Office Action mailed Oct. 5, 2009; U.S. Appl. No. 11/649,992; (24 pages).

The Patent Office of the State Intellectual Property Office of the People's Republic of China (SIPO); First Office Action including translation dispatched Oct. 9, 2009; Application No. 200780000772. 3; 24 Pages total (pp. 1-11 original, pp. 12-24 translation).

The Patent Office of the State Intellectual Property Office of the People's Republic of China (SIPO); Second Office Action including translation dispatched Apr. 8, 2010; Application No. 200780000772. 3; 18 Pages total (pp. 1-8 original, pp. 9-18 translation).

USPTO; Notice of Allowance mailed Apr. 15, 2010; U.S. Appl. No. 11/649,992; (6 pages).

European Patent Office; Extended Search Report mailed Apr. 30, 2010; Application No. 07709602.2; (6 pages).

The Patent Office of the State Intellectual Property Office of the People's Republic of China (SIPO); Notice of the First Office Action including translation dispatched May 14, 2010; Application 20070019502.1; 8 Pages total (pp. 1-3 original, pp. 4-8 translation).

USPTO; Supplemental Notice of Allowance mailed Jun. 29, 2010; U.S. Appl. No. 11/649,992; (2 pages).

Austrian Patent Office; Second Written Opinion by the Austrian Patent Office mailed Jul. 9, 2010; Singapore Patent Application No. 200800396-4; (5 pages).

The Patent Office of the State Intellecutal Property Office of the People's Republic of China (SIPO); Third Office Action including translation dispatched Jul. 30, 2010; Application No. 20070000772. 3; 9 Pages total (pp. 1-4 original, pp. 5-9 translation).

PCT; International Search Report from PCT/US2009/069091 mailed Aug. 17, 2010; (3 pages).

Canadian Intellectual Property Office; First Office Action mailed Sep. 7, 2010; Application No. 2,615,711; (2 pages).

USPTO; Notice of Allowance mailed Sep. 27, 2010; U.S. Appl. No. 12/342,001; (5 pages).

USPTO; Non-Final Office Action mailed Nov. 4, 2010; U.S. Appl. No. 12/477,076; (10 pages).

The Patent Office of the State Intellectual Property Office of the People's Republic of China (SIPO); Fourth Office Action including translation dispatched Nov. 11, 2010; Application No. 200780000772.3; 8 Pages total (pp. 1-3 original, pp. 4-8 translation).
USPTO; Supplemental Notice of Allowance mailed Nov. 17, 2010; U.S. Appl. No. 12/342,001; (3 pages).
USPTO; Supplemental Notice of Allowance mailed Dec. 2, 2010; U.S. Appl. No. 12/342,001; (3 pages).
USPTO; Notice of Allowance mailed Apr. 8, 2011; U.S. Appl. No. 12/477,076; (5 pages).
USPTO; Notice of Allowance mailed Jul. 6, 2011; U.S. Appl. No. 12/852,419; (7 pages).
"Vaganov, Vladimir"; U.S. Appl. No. 13/290,764, filed Nov. 7, 2011; 92 Pages.
PCT; International Search Report and Written Opinion issued in International Patent Application No. PCT/US2012/051942; Mailed Nov. 12, 2012; 13 Pages; FETF.

* cited by examiner

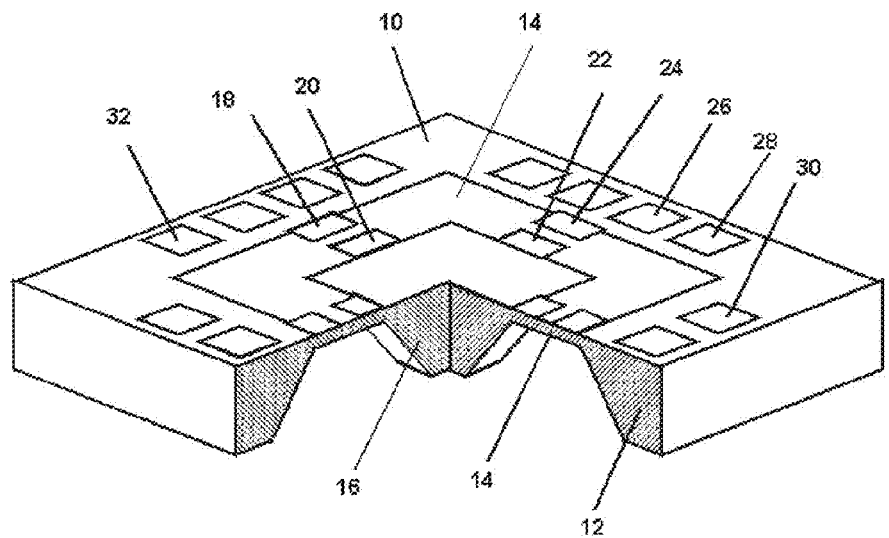
Fig. 1
(PRIOR ART)
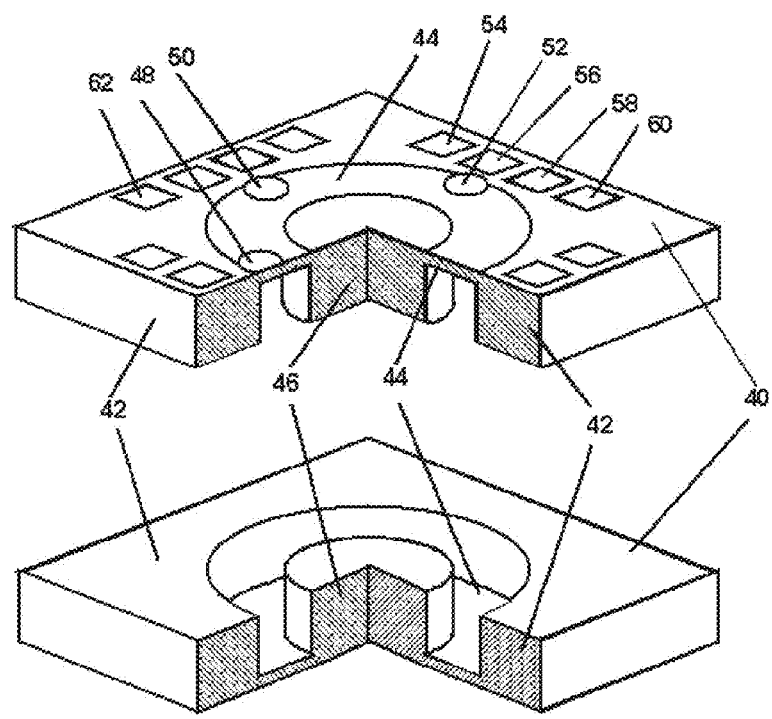
Fig. 2A
Fig. 2B

THREE-DIMENSIONAL INPUT CONTROL DEVICE

CROSS-REFERENCES TO RELATED APPLICATIONS

This application is a Continuation-In-Part of U.S. patent application Ser. No. 12/477,076, entitled THREE-DIMENSIONAL ANALOG INPUT CONTROL DEVICE, filed Jun. 2, 2009, by Vladimir Vaganov, which is a Continuation of U.S. patent application Ser. No. 11/025,642, entitled THREE-DIMENSIONAL ANALOG INPUT CONTROL DEVICE, by Vladimir Vaganov, filed on Dec. 28, 2004, now U.S. Pat. No. 7,554,167, which claims the benefit of U.S. Provisional Application No. 60/533,409, entitled THREE-DIMENSIONAL ANALOG INPUT POINTING MICRO-DEVICE, by Vladimir Vaganov, filed Dec. 29, 2003;

and this application is a Continuation-In-Part of U.S. patent application Ser. No. 12/852,419, entitled THREE-DIMENSIONAL FORCE INPUT CONTROL DEVICE AND FABRICATION, filed Aug. 6, 2010, by Vladimir Vaganov, which is a Divisional of U.S. patent application Ser. No. 11/649,992, entitled THREE-DIMENSIONAL FORCE INPUT CONTROL DEVICE AND FABRICATION, filed Jan. 4, 2007, by Vladimir Vaganov, now U.S. Pat. No. 7,772,657, which:

is a Continuation-In-Part of U.S. patent application Ser. No. 11/025,642, THREE-DIMENSIONAL ANALOG INPUT CONTROL DEVICE, by Vladimir Vaganov, filed on Dec. 28, 2004, now U.S. Pat. No. 7,554,167, which claims the benefit of U.S. Provisional Application No. 60/533,409, entitled THREE-DIMENSIONAL ANALOG INPUT POINTING MICRO-DEVICE, by Vladimir Vaganov, filed Dec. 29, 2003; and claims the benefit of U.S. Provisional Application No. 60/756,200, entitled THREE-DIMENSIONAL ANALOG INPUT CONTROL DEVICE AND FABRICATION METHOD, by Vladimir Vaganov, filed Jan. 5, 2006;

where all of the above are incorporated in their entirety herein by reference.

BACKGROUND OF THE INVENTION

1. Field of the Invention

This invention relates to semiconductor devices, Micro Electro Mechanical Systems (MEMS), sensors and more specifically to three dimensional (3D) three-axis finger force sensors, finger-mouse and micro-joysticks for consumer and other applications.

2. Background

The 3D force sensors based on micromachined silicon chips with piezoresistors on the flexible diaphragm are known. Prior art shown in FIG. 1, uses a sensor chip 10 from a rigid frame 12 and rigid central part 16 of a die, boss, connected with the frame by a thinner diaphragm 14. The piezoresistors 18,24 are located at the periphery of the diaphragm adjacent to the frame 12 and to piezoresistors 20, 22 are adjacent to the boss 16 and electrically connected into three Wheatstone bridges through contact pads 26,28,30,32 accommodating X, Y and Z components of an applied force vector. The disadvantages of these kinds of known solutions can be summarized as: poor long-term stability due to the metal on the suspension; limited mechanical overload protection; large difference in X, Y, Z sensitivities; large cross-axis sensitivity; no process integration with other sensors and CMOS; no scaling; no solutions for convenient application from an external force; no solutions for providing required combination of applied force and deflection. Furthermore although there is a market need, no such semiconductor components reached the consumer market due to their high cost.

However there is a need for 3-dimensional input force control devices, which would be low cost, small, reliable, stable, providing required ratio between X,Y,Z sensitivities, low cross axis sensitivity, process integration with other sensors and CMOS, further scaling, convenient solutions for applying an external force, required combination of applied force and deflection and manufacturability for high volume consumer markets like cell phones, portable gamers, digital cameras, etc, using user tactile force inputs as part of the user interface. Furthermore, the need for 3-dimensional input control extends beyond X, Y, Z rectilinear coordinate system to any orthogonal system position translation mappings or non-position dimensionality component mappings as well.

SUMMARY OF THE PRESENT INVENTION

Some embodiments provide force input control devices for sensing vector forces and converting them into electronic signals for processing on a substrate. Some of these input control devices comprise: a sensor die comprising: a rigid island, an elastic element coupled to the rigid island, die frame coupled to a periphery of the elastic element, one or more stress sensitive components on the elastic element, and signal processing IC, where the sensor die is sensitive to a magnitude and a direction of a force applied to the rigid island within the sensor die, where the sensor die is coupled electrically and mechanically to a substrate, a spring element coupling an external button, where the force is applied, to the rigid island element, wherein the spring element has a flat geometry and located in a plane parallel to a plane of the substrate, where the spring element is configured to translate a deflection of the button into an allowable force applied to the rigid island.

Further embodiments provide universal remote force input control devices comprising: a base part comprising: a power supply, a wireless communication circuit, a sensor die, a sliding slot and mechanical stops, where the sensor die comprises a frame, a rigid island, an elastic element extending between the rigid island and the frame, and one or more stress-sensitive components; a sliding button, a spring element coupling a body of the button to a force transferring element coupled to the rigid island, and a shell spring element configured to provide a tactile feedback of an action function, where the sliding button comprises a sliding guide configured to cooperate with the sliding slot such that the sliding button is configured to slide in X and Y directions generally parallel with a surface of the elastic element, and where the sliding guide is further configured to protect the sensor die from dust and mechanical particles; wherein the base part and the sliding button are assembled together in such a way that the sliding button is slidably movable relative to the base part in the X and Y directions.

A system and method of 3-dimensional input finger control for electronic device interfaces is presented. This interface device provides a variety of functions for hand-held device controlling directional inputs through the application of finger force. The invention method decouples the finger force vector with respect to axes of an orthogonal coordinate system which includes the steps of 1) providing a semiconductor substrate sensor chip, with the semiconductor sensor chip comprising a frame element, a rigid island element and an elastic element mechanically coupling said frame and said rigid island elements, 2) providing a set of three or more stress-sensitive integrated circuit (IC) components embedded in the elastic element, 3) coupling at least one force-transferring element from a tactile contact button element to a rigid island element of a sensor die, 4) transferring the applied external vector force from the button element through at least one force-transferring element to the rigid island element of the sensor die, thereby generating electrical outputs from application the external force vector through stress-sensitive IC components positioned in the elastic element each carrying the unique direction orthogonal component signal from the force vector, where the IC outputs are functions of input component stresses developed from the force components acting through the stress-sensitive IC components.

The method of 3-dimensional input finger control is further extended through the steps of 1) providing an electronic circuit logic for processing signals from sensors, 2) generating digital signals from the electronic circuit which are representative of the orthogonal component values from an applied external force on to the button, and 3) determining the force vector components of the applied three dimensional external force using the component signal values and the electronic circuit logic in solving at least three equations with at least three unknown vector components.

The apparatus claimed is comprised of a three-dimensional analog input control micro-device for inputting analog mechanical signals into a digital processing system with 1) a sensor die formed within semiconductor substrate, 2) an elastic element diaphragm within said semiconductor substrate, 3) a frame formed around the elastic element and coupled with at least part of the periphery of said elastic element all within the substrate, 4) at least three mechanical stress sensitive IC components located in the elastic element for providing electrical output signals proportional to the mechanical stress in the location of the IC components, 5) at least one rigid island element formed in the substrate and coupled within the elastic element, 6) at least one rigid force-transferring element coupled to the rigid island of a sensor die formed from the substrate and which transfers an external vector force in orthogonal component directions, by decoupling the components through the IC components which carry the mechanical stress only in their respective unit positioned directions, 7) at least one spring element coupling the sensor die with an external button element for accepting an external vector force, 8) at least one electronic circuit for processing output signals from the mechanical stress sensitive IC components using the component signal and the electronic circuit logic in solving at least three equations with at least three unknown vector components.

All elements can vary in design and material in order to realize different aspects and advantages.

A first alternate preferred embodiment of the method of the present invention provides an input device for inputting analog mechanical signals into a digital processing system, wherein the input device comprises, or is coupled with, one or more of the following elements or means:

a semiconductor substrate;
an elastic element formed in the semiconductor substrate;
a frame formed around an elastic element and connected with at least part of the periphery of the elastic element;
one or more mechanical stress sensitive components located in at least three different areas of an elastic element, and providing electrical output signals substantially proportional to the mechanical stress experienced at a location of at least one of these components;
a substantively rigid island or boss formed in a remote or central area of or from a frame and the island or boss-connected by at least three points with an elastic element;
means for transducing or transferring a force or pressure externally applied to the input device, e.g. a micro-mouse or a micro-joystick, from an exterior of the input device and to an island or boss, and a means for transferring pressure or force applied to the island or boss into a deformation of an elastic element by mechanical stress proximate to a location of sensitive components, and a means for providing at the same time a measurement range and measurement accuracy of external pressure or force and required motion or displacement of one or more elements of the input device;
a package or substrate providing integration of two, more than two or all the subcomponents, components or elements of the input device;
a semiconductor substrate and a means for transferring external force and providing mechanical and electrical connections of the device within the system;
an electronic circuit for processing output signals from the mechanical stress sensitive components and providing the separation of the three-dimensional output signals in either Cartesian or spherical system of coordinate;
a semiconductor substrate comprising material made with one or more elements selected from the IV group of the Periodic Table;
a semiconductor substrate comprising silicon;
a semiconductor substrate comprising germanium;
a semiconductor substrate comprising silicon carbide;
a semiconductor substrate comprising diamond like carbon;
a semiconductor substrate comprising material which comprises a compound of the elements from III and V groups of the Periodic Table;
a semiconductor substrate comprising gallium arsenide;
a semiconductor substrate comprising gallium nitride;
a semiconductor substrate comprising indium phosphide;
an elastic element formed in or coupled with the semiconductor substrate comprising or comprised within a diaphragm;
a diaphragm of or coupled with the semiconductor substrate material having a uniform thickness;
a uniform diaphragm formed in the semiconductor substrate having at least one boss located at some distance from the edge of the diaphragm;
a diaphragm formed in the semiconductor substrate that is thinner in at least one local
a diaphragm formed in the semiconductor substrate having corrugations in at least one local area;
a diaphragm formed in the semiconductor substrate having at least one through opening;
an elastic element formed in the semiconductor substrate comprising at least one beam connected with a central island or boss;
an elastic beam formed in the semiconductor substrate and the elastic beam having a substantively uniform thickness;
an elastic beam formed in the semiconductor substrate having a portion with at least one boss located at some distance from an end of the beam;
a diaphragm formed in the semiconductor substrate having at least a partial substantially rectangular shape;
a diaphragm formed in the semiconductor substrate having at least a partial substantially square shape;

a diaphragm formed in the semiconductor substrate having at least a partial substantially hexagonal shape;
a diaphragm formed in the semiconductor substrate having at least a partial substantially octagonal shape;
a diaphragm formed in the semiconductor substrate having at least a partial substantially circular shape;
a diaphragm formed in the semiconductor substrate having at least one stress concentrating element;
a diaphragm formed in the semiconductor substrate having a stress-concentrating element presenting a groove;
a diaphragm formed in the semiconductor substrate having a stress-concentrating element presenting a groove having a trapezoidal cross section;
a diaphragm formed in the semiconductor substrate having a stress-concentrating element comprising a V-groove;
a diaphragm formed in the semiconductor substrate having a stress concentrating groove having the sidewalls forming an angle in the range of 90°±5° with the surface of the diaphragm;
a diaphragm formed in the semiconductor substrate having at least one stress concentrating element comprises located on a beam;
a diaphragm formed in the semiconductor substrate having at least one stress concentrating element comprising a groove;
a diaphragm formed in the semiconductor substrate having at least one stress concentrating element comprising a groove having a trapezoidal cross section;
a diaphragm formed in the semiconductor substrate having at least one stress concentrating element comprising a V-groove;
a diaphragm formed in the semiconductor substrate having at least one stress concentrating element comprising stress concentrating groove having sidewalls forming an angle in the range of 90°±5° with a surface of a beam;
a frame formed around an elastic element used for connection or bonding with at least one additional element of sensor micro-construction;
a frame formed around an elastic element used for electrical and mechanical connection of a die with a package or a PCB of the system;
a frame formed around an elastic element used for connection or bonding with at least one additional element of a sensor micro-construction comprising a cap, protecting sensor from harmful effects of environment;
an additional element of a sensor micro-construction comprising a cap, protecting sensor from mechanical overload;
an element of a sensor micro-construction comprising a cap, providing damping of a mechanical resonant frequency of the sensor;
an element of a sensor micro-construction comprising an inlet and providing access of a physical parameter to the sensitive area of a sensor;
an element of a sensor micro-construction comprising a damper, the damper providing isolation of the transducing components of the sensor from mechanical and thermo-mechanical stresses, the stresses coming from the package, from inside the package and/or from outside of the package;
a frame formed around an elastic element used for integration of at least one additional electronic circuit;
an electronic circuit containing at least one amplifier;
an electronic circuit containing at least one multiplexer;
an where electronic circuit containing at least one analog-to-digital converter;
an electronic circuit containing at least one digital-to-analog converter;
an electronic circuit containing at least one microprocessor;
an electronic circuit containing flash memory;
an electronic circuit containing EEPROM;
an electronic circuit containing I/O interface circuit;
a rigid island or boss formed in a remote or central area of from, or coupled with the frame and connected by at least three points to an elastic element at least partially formed at least partially in a shape substantively close to a pyramid, cone, cylinder, semi-sphere, sphere, and/or other suitable shape known in the art;
a rigid island or boss formed in a remote or central area of from, or coupled with the frame and connected by at least three points to an elastic element having a hole in the central part of the boss, wherein the hole may be substantively round, square, rectangular, oval, and/or other suitable shape known in the art;
a rigid island or boss formed in a remote or central area of from, or coupled with the frame and connected by at least three points to an elastic element having an area of flat surface parallel to the initial plane of the wafer (laying in the plane of the initial surface of the wafer)
a rigid island or boss formed in a remote or central area of from, or coupled with the frame and connected by at least three points to an elastic element having at least one cavity or one mesa to improve coupling force (adhesion) with additional force-transferring elements;
a means for transferring measured force comprising a springy element mechanically connected with a rigid boss and providing transferring externally applied pressure and/or force and displacement into deformation and mechanical stress in the elastic element proportional to the force and/or displacement;
a force-transferring element comprising two links, a link connected directly to the boss and a second link connected to the first link and providing the connection with a source of externally applied pressure or force;
a force-transferring element having first link of a means for transferring applied force, the first link comprising a rigid element mechanically connected a rigid boss on an elastic element;
a rigid first link of a means for transferring applied force having at least one cavity or one mesa to improve coupling force with a plastic elastic second link of means for transferring applied force;
a force-transferring element at least partially in a shape of a washer, plate, stick, turned over mushroom, cone, or other suitable shape known in the art;
a first link of a means for transferring measured force comprising a springy element mechanically connected with a rigid boss;
a first link of a means for transferring a measured force comprising a springy element mechanically connected with a rigid boss, where the springy element comprises a springy wire;
a first link of a means for transferring a measured force comprising a springy element mechanically connected with a rigid boss, where the springy element comprises a spine-like structure;
a second link of a force-transferring element comprising a plastic shell, e.g., a cover, package, dome, or other suitable protective element known in the art, and connected to a first link and the second link while providing a connection to the input device to a source of an externally applied pressure or force;

a pressure or force-transferring element having at least one cavity filled in with liquid or gel providing transferring of externally applied pressure or force;

a pressure or force transferring element comprising silicon;

a pressure or force transferring element comprising metal or alloy;

a material comprised within a pressure or force transferring element containing at least one of the materials selected form the group consisting of copper, tin, lead, gold, silver, nickel, tungsten, and bismuth;

an intermediate layer coupling an elastic element and a pressure or force-transferring element, the intermediate layer comprising a polymer;

an intermediate layer coupling an elastic element and a pressure or force-transferring element, the intermediate layer comprising a solder;

an intermediate layer coupling the elastic element and pressure or force-transferring element, the intermediate layer comprising a frit-glass;

an intermediate layer coupling the elastic element and pressure or force-transferring element, the intermediate layer comprising a negative photoresist;

an adhesive coupling an elastic element and a pressure or force-transferring element, the adhesive comprising a polyimide based compound;

a stress sensitive component integrated at the surface of an elastic element, the stress sensitive component comprising a piezo-resistor;

a stress sensitive component integrated at the surface of an elastic element, the stress sensitive component comprising a pn-junction;

a stress sensitive component integrated at the surface of an elastic element, the stress sensitive component integrated at the surface of an elastic element, the stress sensitive component comprising a tunnel diode;

a stress sensitive component integrated at the surface of an elastic element, the stress sensitive component comprising a shear stress component;

a stress sensitive component integrated at the surface of an elastic element, the stress sensitive component comprising a Hall effect component;

a stress sensitive component integrated at the surface of an elastic element, the stress sensitive component comprising piezo-resistive Wheatstone bridge;

a stress sensitive component integrated at the surface of an elastic element, the stress sensitive component comprising a three-port-pole component integrated at the surface of elastic element;

a stress sensitive component integrated at the surface of an elastic element, the stress sensitive component comprising a MOS transistor;

a stress sensitive component integrated at the surface of an elastic element, the stress sensitive component comprising a complementary pair of CMOS transistors;

a stress sensitive component integrated at the surface of an elastic element, the stress sensitive component comprising a bipolar transistor;

a stress sensitive component integrated at the surface of an elastic element, the stress sensitive component comprising comprises a bipolar transistor and at least one piezo-resistor connected to a transistor;

a stress sensitive component integrated at the surface of an elastic element, the stress sensitive component comprising a MOS transistor and at least one piezo-resistor connected to a transistor;

a stress sensitive component integrated at the surface of an elastic element, the stress sensitive component comprising a pair of p-n-p and n-p-n bipolar transistors; and an electrical circuit providing at least one of the following functions: analog amplifying, analog multiplexing, analog-to-digital conversion, signal processing, memory for compensation coefficients, digital interface, power management, transmitting and receiving radio-signals, and management of charging of or from piezoelectric elements.

BRIEF DESCRIPTION OF DRAWINGS

FIG. 1 is a view of a prior art 3D force sensor die.

FIG. 2A shows an isometric top view of a force sensor die and its major micro-constructive elements according to the first embodiment of the present invention.

FIG. 2B shows a bottom view of the force sensor die of FIG. 2A and its major micro-constructive elements according to the first embodiment of the present invention.

DETAILED DESCRIPTION OF THE PREFERRED EMBODIMENTS

Figure 3:
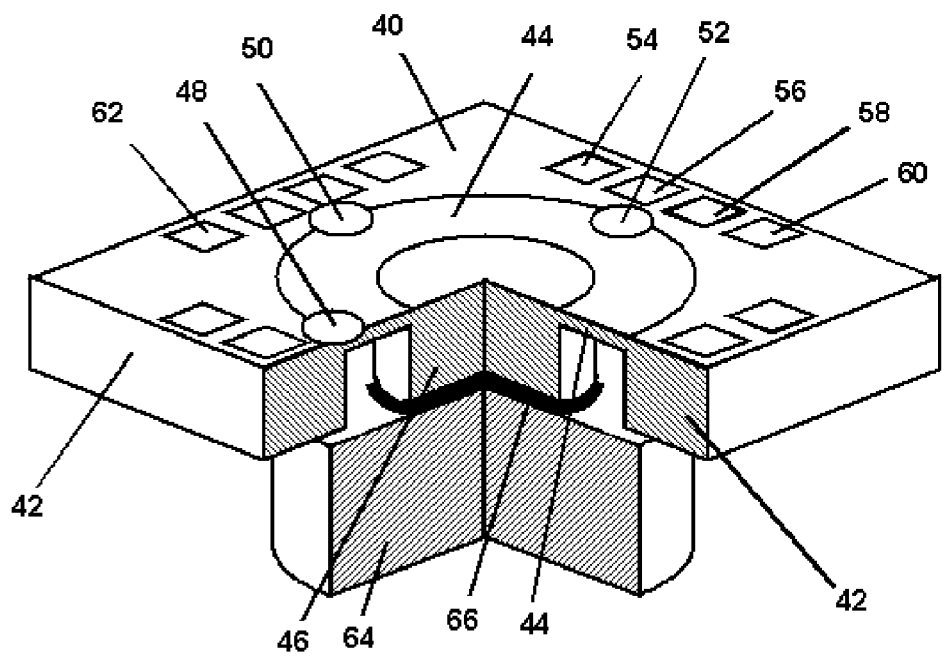
FIG. 3 shows and isometric cross-section view of a die with a rigid force-transferring element connected to the profiled side of a sensor die according to the second embodiment of the present invention.
Figure 4:
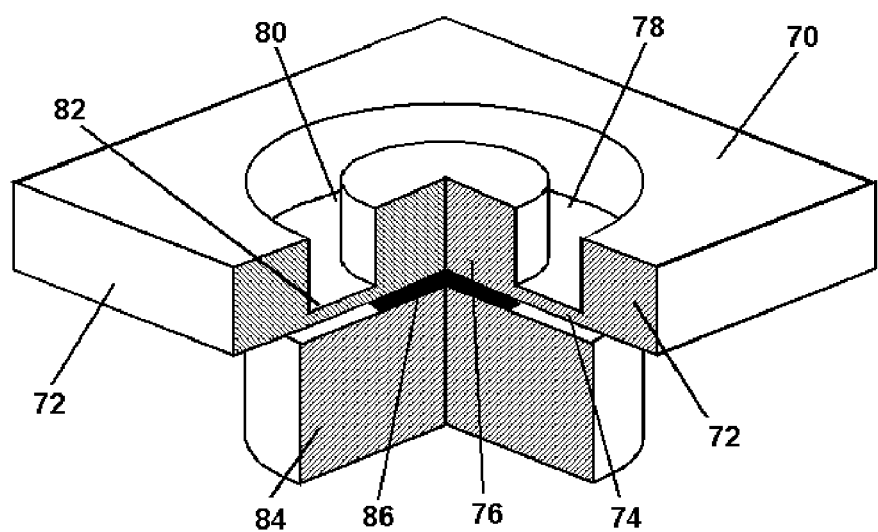
FIG. 4 shows an isometric cross-section view of a die with a rigid force-transferring element connected to the planar side of a sensor die according to the second embodiment of the present invention.

Some embodiments provide a method of 3-dimensional input finger control of different functions in electronic consumer devices.

Further, some embodiments provide a 3-dimensional input finger interface control device for high volume consumer markets like cell phones, portable gamers, digital cameras, etc.

Some embodiments provide a low cost 3-dimensional input finger force control device.

Still further, some embodiments provide a small size of a 3-dimensional input finger force control device.

Some embodiments provide a high reliability 3-dimensional input finger force control device.

Further, some embodiments provide a high stability 3-dimensional input finger force control device.

Furthermore, some embodiments provide a 3-dimensional input finger force control device, which accommodates a required ratio between X,Y,Z sensitivities.

Still further, some embodiments provide a 3-dimensional input finger force control device, which has low cross-axis sensitivity.

Some embodiments provide a 3-dimensional input finger force control device, which allows process integration with other sensors and CMOS.

Some embodiments provide a 3-dimensional input finger force control device, which is scalable.

Further, some embodiments provide a 3-dimensional input finger force control device, which allows convenient solutions for applying an external force.

Some embodiments provide a 3-dimensional input finger force control device, which allows required combination of applied force and deflection.

Some embodiments provide a 3-dimensional input finger force control device, which allows economic manufacturability for high volume consumer markets.

Some embodiments provide a 3-dimensional input interface control devices for high volume consumer markets, such as but not limited to cell phones, portable gamers, digital cameras, etc.

Additionally or alternatively, some embodiments provide input finger control devices with low profile while providing large deflections in the plane of the device, which may be critical for such applications, as portable gaming devices.

FIGS. 2A-21B show various embodiments of finger force control devices and dice microstructures. The detailed description of the microstructures and devices according to the present invention are presented below in thirteen embodiments.

Referring to the embodiment of FIGS. 2A-2B, the isometric and a cross section view of the top planar side of the force sensor die and its major micro-constructive elements are shown in FIG. 2A. The isometric cross sectional view of the bottom side of the die are shown in FIG. 2B. The die 40 has frame 42 surrounding an elastic element 44. In this embodiment the elastic circular element 44 acts as a diaphragm. A central rigid island 46 is situated within the center of the diaphragm 44. On a circular diaphragm 44 planar top side there are a number of areas 48, 50, 52 where mechanical stress sensitive IC components are effectively located. The IC components 48 50 52 are located on the periphery of the diaphragm adjacent to a frame 42, and electrically connected to contact pads 54, 56, 58, 60, 62, without metal conductors on the surface of a diaphragm. This yields better sensor stability.

An externally applied force is transferred to the rigid island 46, the deflection of the island creates deformation and stress in the elastic diaphragm element 44, reaching the locations of the stress sensitive IC components 48, 50, 52. These three sensitive IC components create a unique combination of the signals relative to a specific value and direction of the applied vector force. Calibration and processing sensor signals allows determination of the values of the force vector components and therefore also the value and a direction of the externally applied force. Because the rigid island 46 is located within the thickness dimension of a die 40 and the width of a diaphragm is much smaller and in the sub-millimeter range, and deformation from external force in lateral X and Y directions are not sufficiently sensitive to provide good load following characteristics.

In order to resolve this deficiency, in the microstructure, according to a second embodiment, as illustrated in the FIG. 3, a rigid force-transferring element 64 is added to the die 40 and island 46 structure. This rigid force-transferring element 64 is firmly coupled to the rigid island 46 of a sensor die 40 through a intermediate layer 66 at the wafer semi-conductor level. The cost of manufacturing is consequently reduced dramatically due to the batch processing economies of scale. The presented microstructure embodiment enhances sensor sensitivity to the applied vector force in all orthogonal directions following the rigid force-transferring element 64 stresses. These components of force are transferred to a rigid island of the sensor die and then to the elastic element and sensitive IC components. In this embodiment the rigid force-transferring element 64 is attached to a rigid island 46 from the backside of the wafer directly to the profiled island. In a wafer microstructure illustrated in FIG. 4, the rigid force-transferring element 84 is attached to a rigid island 76 from the planar side 78 of the die 70 through an intermediate layer 86 of an adhesive material. This rigid coupling does not extend to the remainder of a sensor die 72 either in the area of elastic element 74 or the frame 72 of the die. Both embodiments of FIG. 3 and FIG. 4 can be used depending on the requirements set forth to the entire construction of the sensor.

As illustrated in FIGS. 5A-5D the micro-structure of a rigid force-transferring element can have a different shape according to a third embodiment. The rigid force-transferring element 90, as it shown in FIG. 5A, has a multi-facet pyramid geometry attached to a rigid island 46 of a sensor die through an intermediate layer 66. The angled facets of the sidewalls of the rigid force-transferring element 90 are positioned for transferring all components of an applied force vector. Fabricate of this structure can be done by anisotropic etching of the patterned wafer of the rigid force-transferring elements. However, it does not provide the best adhesion to the external materials coupled to the top of the rigid force-transferring element 90, which is often required in practice.

Figure 5A:
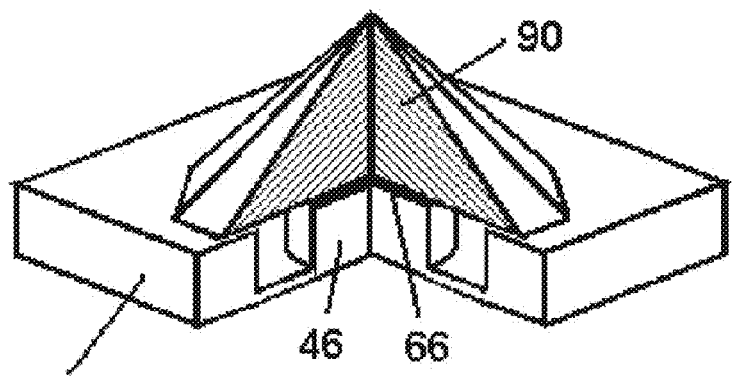
FIG. 5A shows an isometric cross-section of a die with an alternate design of a rigid force-transferring element connected to the profiled side of a sensor die, alternate transferring element which provides alternate transfer force and gripping force according to an embodiment of the present invention.
Figure 5B:
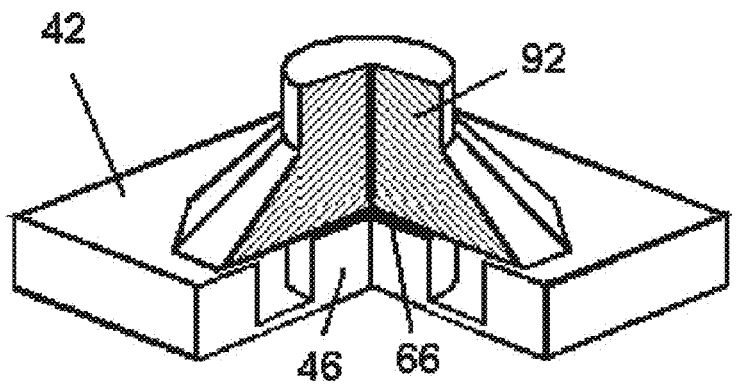
FIG. 5B shows an isometric cross-section of a die with an alternate design of a rigid force-transferring element connected to the profiled side of a sensor die, alternate transferring element which provides alternate transfer force and gripping force according to an embodiment of the present invention.

The micro-structure shown in FIG. 5B provides some improvement. The microstructure of a rigid force-transferring element 92 has a blunt geometry providing more coupling surface and therefore a better adhesion to the external materials of the rigid force-transferring element, because, as a rule, the sheer force of adhesion to the cylindrical part of the element is much higher than the normal or angled to the surface adhesion force.

Figure 5C:
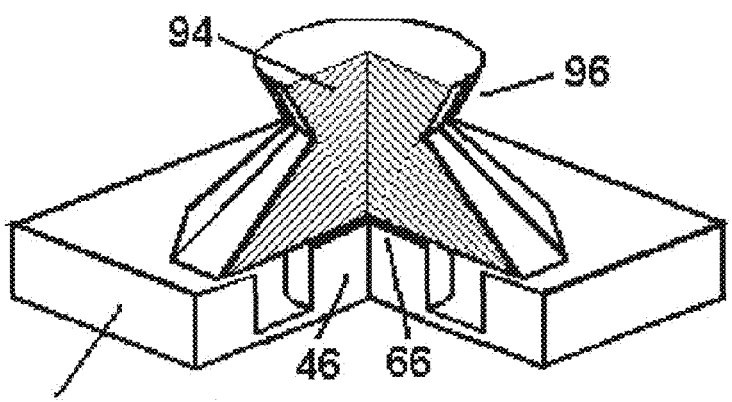
FIG. 5C shows an isometric cross-section of a die with an alternate design of a rigid force-transferring element connected to the profiled side of a sensor die, alternate transferring element which provides alternate transfer force and gripping force according to an embodiment of the present invention.

The microstructure shown in FIG. 5C provides even more improvement due to the increased coupling surface. The microstructure of a rigid force-transferring element 94 has a part of a microstructure with negative angle of sidewalls 96. If external material is applied to the rigid force-transferring element 94, then it will be hold stronger due to the negative slopes of the structure.

Figure 5D:
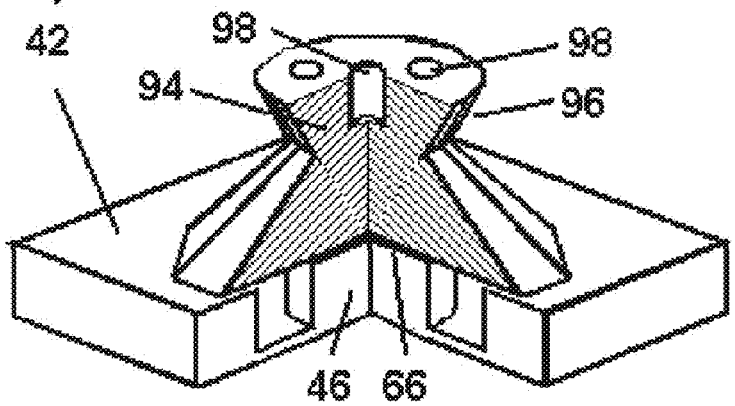
FIG. 5D shows an isometric cross-section of a die with an alternate design of a rigid force-transferring element connected to the profiled side of a sensor die, alternate transferring element which provides alternate transfer force and gripping force according to an embodiment of the present invention.

The micro-structure shown in FIG. 5D illustrates yet another improvement. The microstructure of a rigid force-transferring element 94, in addition to having microstructure with negative angle of sidewalls 96, also has micro-structural cavity 98 elements, or mesas, or bridges, or any other non-uniformities increasing an adhesion of external materials applied to the rigid force-transferring element 94.

Figure 6A:
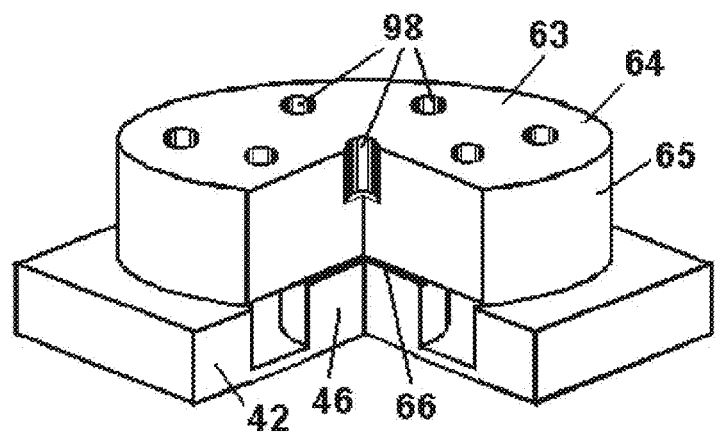
FIG. 6A shows an isometric view of a die with a rigid force-transferring element connected to the profiled side of a sensor die, which has a comparable size with a sensor die and provide improved gripping force to the force-transferring element according to the fourth embodiment of the present invention.
Figure 6B:
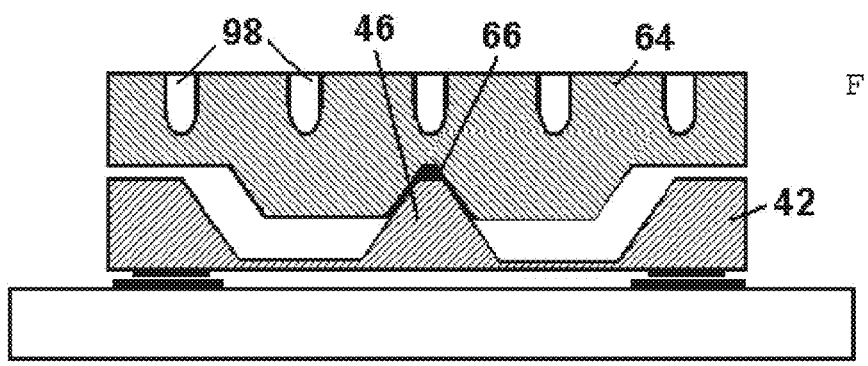
FIG. 6B show a cross-section of a die with a rigid force-transferring element connected to the profiled side of a sensor die, which has a comparable size with a sensor die and provide improved gripping force to the force-transferring element according to an embodiment of the present invention.

In some cases, as it shown in FIGS. 6A-6B according to a fourth embodiment, the size of a rigid force-transferring element 63 should be comparable to a size of a sensor die 42. In this case the top surface 63 of the rigid force-transferring element 64 is much higher than the sidewall surface 65 and therefore, the Z-component of the applied force can be transferred better than the X and Y components. In this situation it is more important to increase the adhesion of the external materials applied to a rigid force-transferring element in the direction of lateral X and Y forces. It can be done in a different ways. One of them is to create a number of non-uniformities like cavities 98, holes, mesas, bridges, etc., which will accept an external material and improve an adhesion to the rigid force-transferring element 63. The remaining sensor die element 42 and adhesion coupler 66 act as described above.

FIG. 6B illustrates similar approach achieved by anisotropic etching of both sensor die 42 and rigid force-transferring element die 64 wafers. The cavities 98 might be fabricated either with RIE, isotropic or anisotropic etching.

The challenge of practical application of described sensors, as input force controlled devices, is that the deflection of the rigid island of rigid force-transferring 64 element firmly connected to the rigid island 46 is negligible. The psychological reaction on the control of the applied force is based only on the applied force or, for example pressure on the finger in case of the finger force control. If the finger would have some range of deflection, then it would increase the accuracy of applying input signals providing at the same time the required range of applied force and sensitivity of the device.

Figure 7:
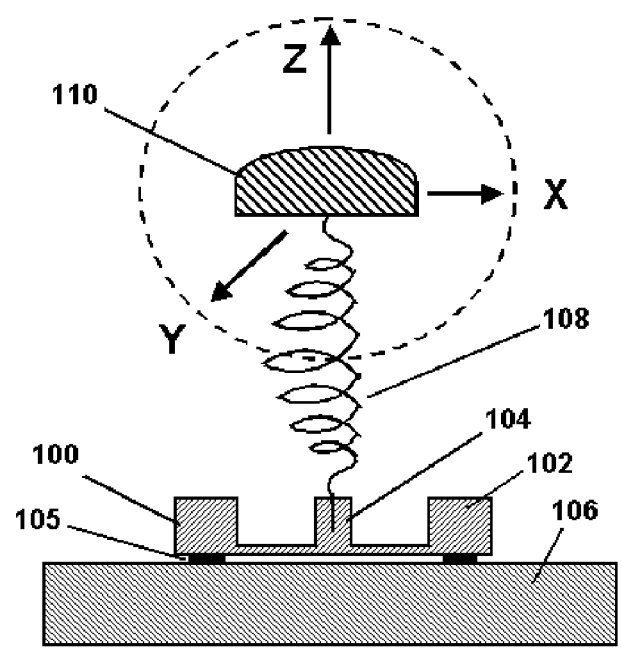
FIG. 7 shows the principle of a method of 3-dimensional input finger control of different functions in hand-held devices, where 3D force sensor die is connected to the external button for applying the force through a spring like element allowing control to achieve the required combination of sensitivity, range and accuracy of applied force according to the fifth embodiment of the present invention.

The embodiment design resolving this issue is illustrated in FIG. 7 according to a fifth embodiment. A two ended spring element 108 is added to a sensor. The first end of spring element 108 is coupled to a rigid island 104 of a sensor die 100, which has a frame 102 and contact pads 105. The second end of the spring element 108 is connected to a button 110, where the external force vector is applied. The spring element 108 phases the deflection, increases the range of motion or applied force and accuracy of the input mechanical signal. As another benefit, the spring element 108 also increases the range of the opportunities in designing the microstructure of the sensor die for better performance from variable stiffness, reliability and cost.

Figure 8:
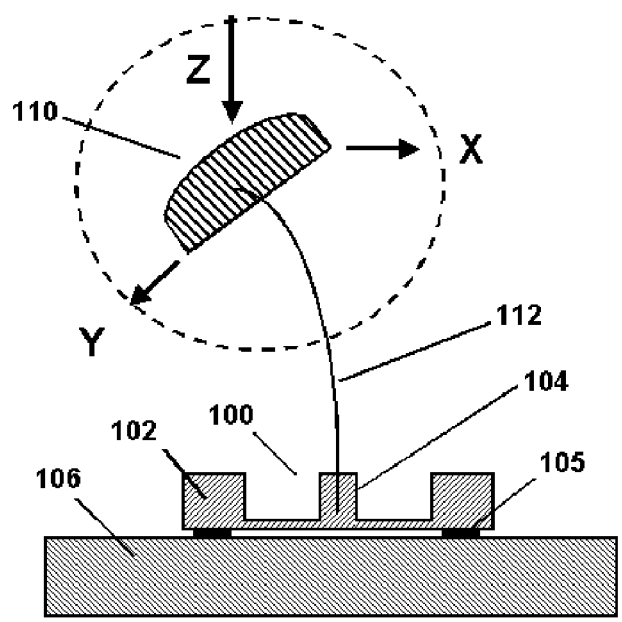
FIG. 8 shows an example of a spring like element, which can be a thin rigid wire, connecting external button force vector with sensor die according to the fifth embodiment of the present invention.

The spring element can be realized in many ways. FIG. 8 illustrates a simple embodiment of a spring element 112, in the form of a stiff wire 112 coupled to a button 110 on one end and a rigid island 104 on the other end. Applied force to a button 110 in different directions X, Y and Z is transferred through the wire spring element 112 and rigid island 104 to an elastic element and stress sensitive IC components in the sensor die element 102.

Figure 9:
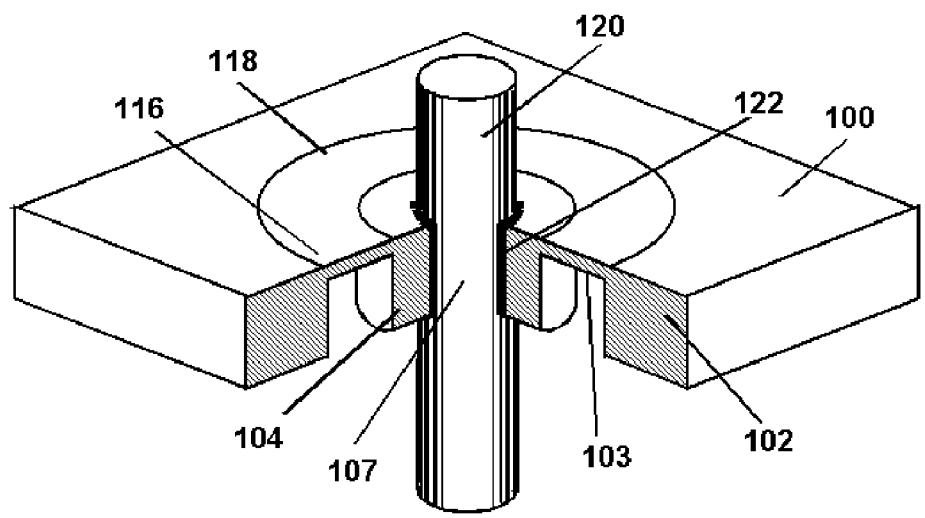
FIG. 9 shows how a spring element can be connected to the force sensor die according to the sixth embodiment of the present invention.

As illustrated in FIG. 9, a spring element 120 shown as a wire 120 is connected to a sensor die 100 according to a sixth embodiment. The opening 107 in the sensor die 100 was fabricated in the rigid island 104. The wire 120 is installed into a opening 107 and fixed there with the adhesive material layer 122. The wire 120 can be installed from either direction: from planar side of the die or from back profiled side of the die, depending on the final design of the package and the desired position of the die within the package.

Figure 10:
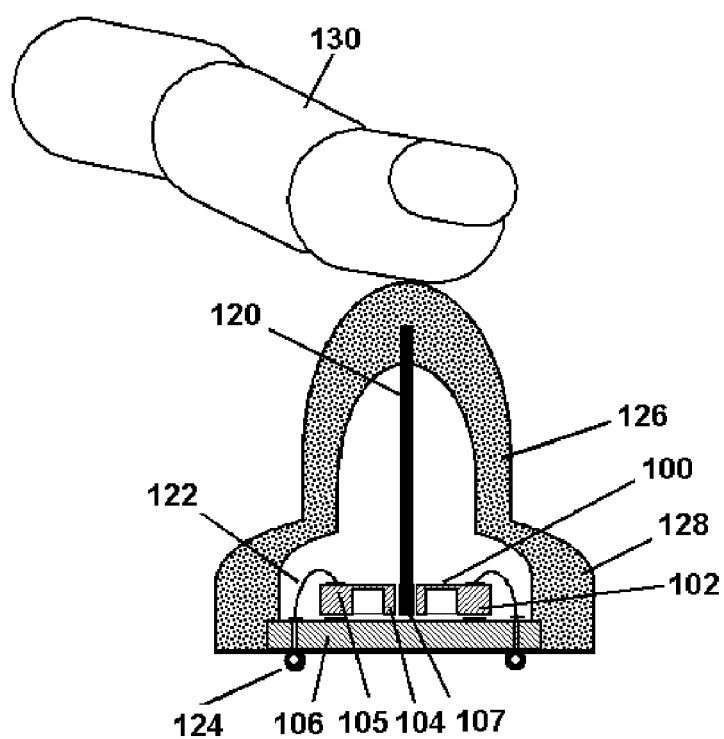
FIG. 10 shows an example of a finger force control device based on a spring like wire element connected to the force sensor die according to the sixth embodiment of the present invention.

FIG. 10 illustrates a version of the mutual positioning of the spring element wire 120 and the sensor die where the wire 120 is extended from the planar side of the die 100. The spring element wire 120 is connected to a rigid island 104 of the sensor die 100. The die is bonded to a substrate 106 in the area of the frame 102. The contact pads 105 of the die 100 are coupled with the bonded electrical wires 122 to external contact pads 124, which can be connected with for example solder balls. The external plastic package 128 anchors the substrate 106 and extends with its flexible part 126, as a pertruding elastomeric supporting the other end of a spring element wire 120 forming a button, where the external force, from the finger 130 force, can be applied.

Figure 11:
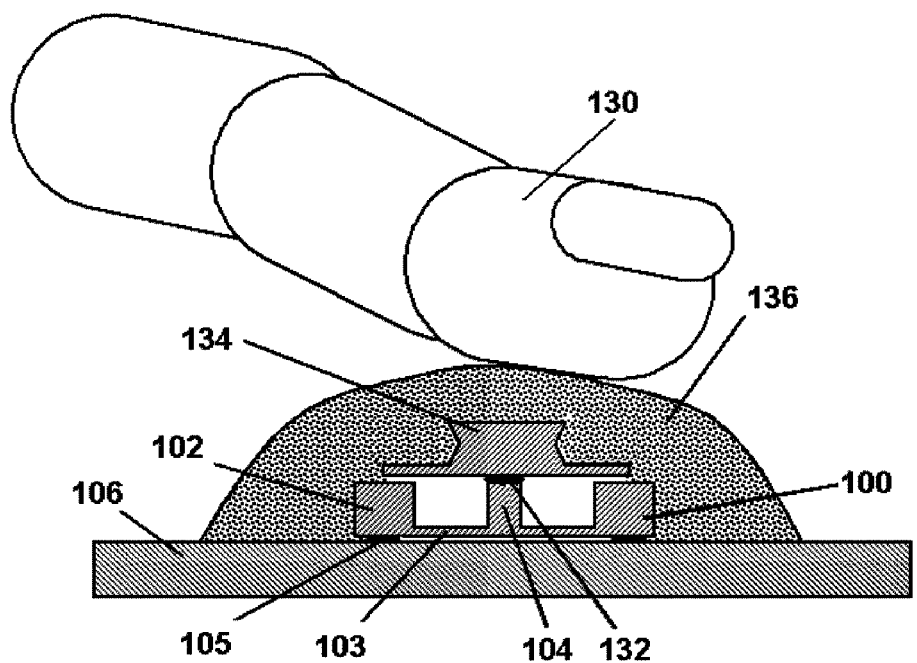
FIG. 11 shows an example of micro-construction of a flat finger force control device based on a elastomeric button directly connected to the rigid force-transferring element coupled to the force sensor die according to the seventh embodiment of the present invention.
Figure 12:
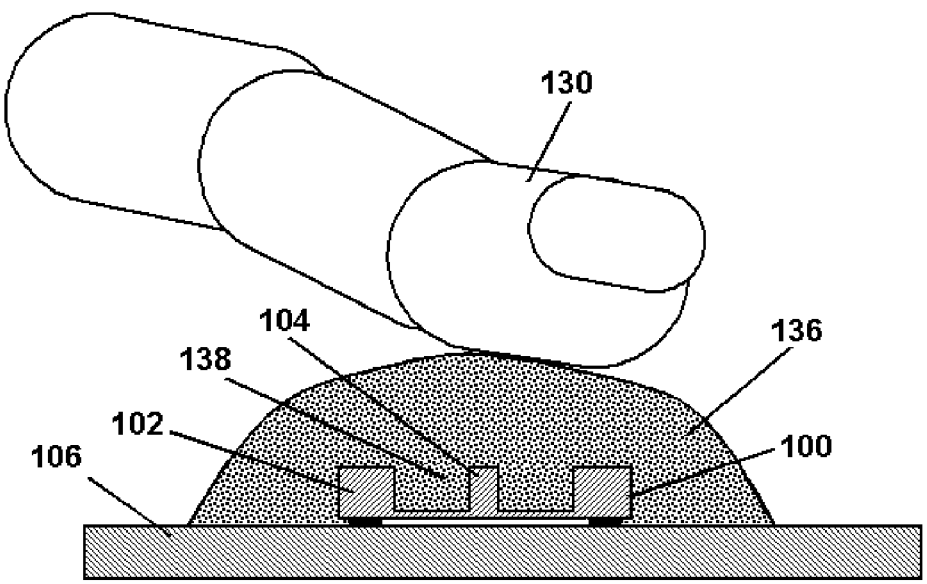
FIG. 12 shows an example of a flat finger force control device based on a elastomeric button directly connected to the force sensor die according to the seventh embodiment of the present invention.

As illustrated in FIG. 11, for some finger mouse applications, where there is no need for a large deflection of a button an input force controlled devices can be shaped as a flat button according to a seventh embodiment. The sensor die 100 is bonded to a substrate 106 with the contact pads 105. Rigid force-transferring element 134 is bonded to a rigid island 104 of a sensor die 100 with intermediate layer 132. The sensor die 100 together with the rigid force-transferring element 134 are covered with elastic plastic material 136 forming a desired shape of a button. The external force is applied to an elastic button, for example by a finger 130. Normal and sheer force are transferred through the elastic material of a button to the rigid force-transferring element 134 and then to the rigid island 104, elastic element 103 and finally to the stress sensitive IC components, which result in output electrical signals proportional to external force.

Where the size of a sensor die and the viscosity and elasticity of an elastic material of the plastic button are compatible, a rigid force-transferring element may not be warranted, as is shown in the FIG. 12. The elastic plastic material 136 covers the sensor die 100 directly from the back profiled side filling in the cavity 138 between the frame 102 and the rigid island 104. Normal and sheer force applied by a finger are transferred through the elastic material of a button directly to the rigid island 104 and then to the stress sensitive IC components.

Figure 13A:
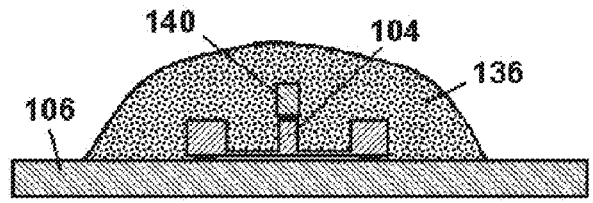
FIG. 13A shows an example of a flat finger force control device based on an elastomeric button directly connected to a rigid force-transferring element according to the seventh embodiment of the present invention.
Figure 13B:
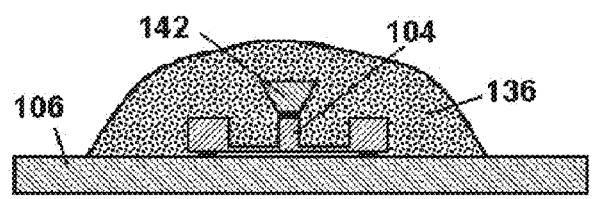
FIG. 13B shows an example of a flat finger force control device based on an elastomeric button directly connected to a rigid force-transferring element.
Figure 13C:
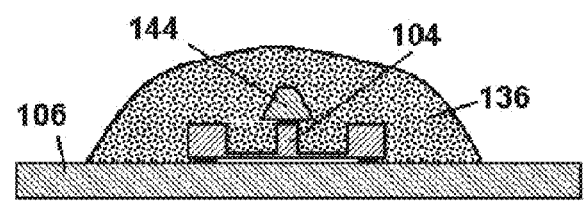
FIG. 13C shows an example of a flat finger force control device based on an elastomeric button directly connected to a rigid force-transferring element.

However, the presence of the rigid force-transferring element is increases flexibility of design in order to meet differing application requirements. FIGS. 13A-13C illustrate different design options for the rigid force-transferring element 140 142 144.

Figure 14:
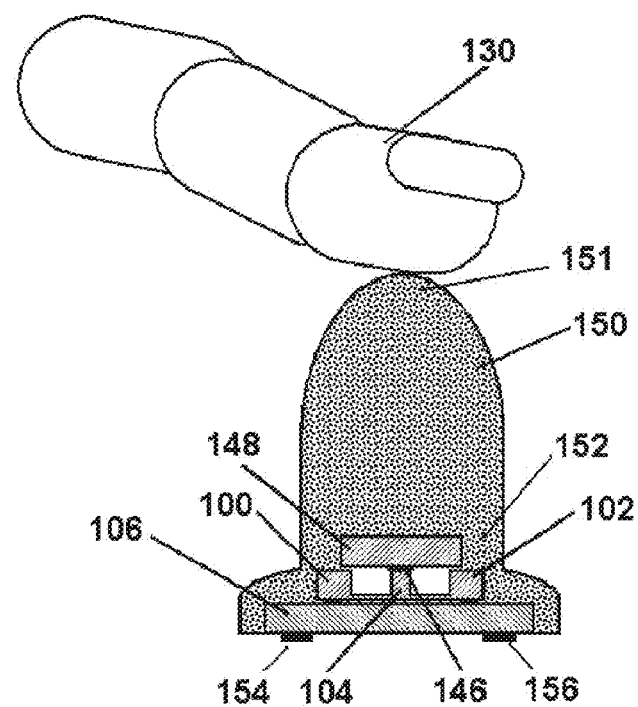
FIG. 14 shows an example of a protrusion type finger force control device based on a elastomeric protrusion body spring back deformable element directly coupled with the rigid force-transferring element transferring the force vector to the sensor die according to the eighth embodiment of the present invention.

As illustrated in FIG. 14, the spring element 150 providing required range of deflection and sensitivity can be made from the elastic plastic material according to eighth embodiment. In this embodiment the sensor die 100 and the rigid force-transferring element 148 are mounted on the substrate 106. The elastic plastic package material 150 covers the above elements and forms a flexible protrusion. The extended end of the protrusion 151 serves as a button for tactile contact. An external force applied, via finger 130, to a button 151 bends the protrusion 150 creating mechanical stress and deflection within the plastic in the device base area 152 between the sensor die and the rigid force-transferring element 148. This induced stress is transferred to the sensor die and finally to the stress sensitive IC components. This design of a micro-joystick allows achieving very low cost in production due to its design simplicity and existing well-developed mass manufacturing technologies.

Figure 15:
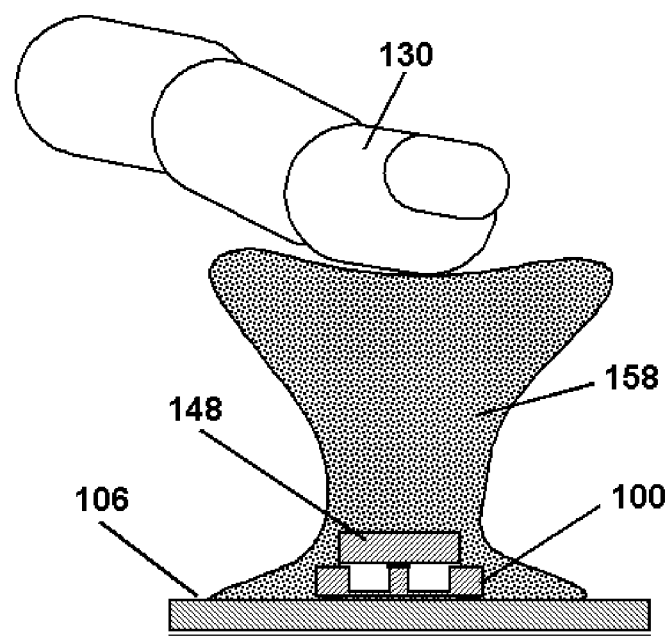
FIG. 15 shows another example of a flattened head protrusion type finger force control device according to the eighth embodiment of the present invention.
Figure 16:
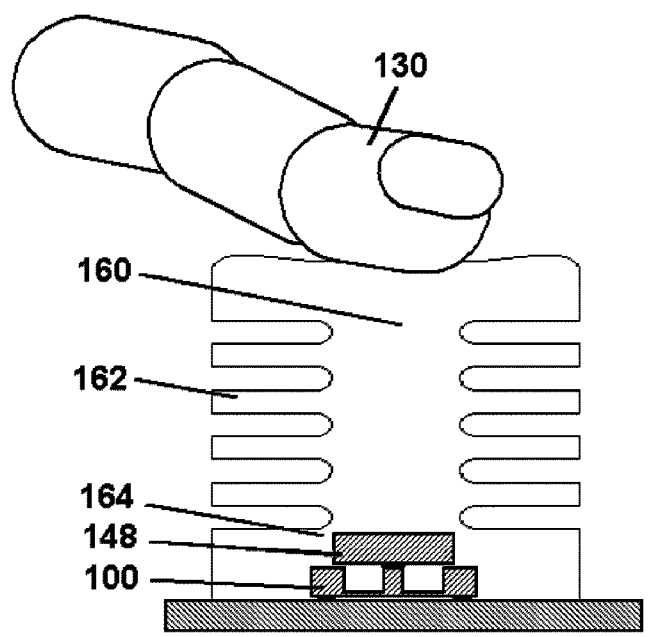
FIG. 16 shows an example of micro-construction of a flexible spine type finger force control device based on a elastic plastic spine working as an additional spring type element directly coupled to the rigid force-transferring element which is coupled to the force sensor die according to the eighth embodiment of the present invention.

Another version of the plastic elastic finger joy-stick with flattened head at the protruding end of the stick is shown in FIG. 15. The plastic stick 158 can be fabricated in various shapes, colors and elasticities depending on the application and requirements.

Although the sensor die for this application can be designed to be very reliable and robust to mechanical overload forces applied to the plastic finger joy-stick it may be required for some applications that the range of stick deflections be limited without affecting flexibility of the stick. For these kinds of applications a micro-construction of the stick using a spine design, shown in FIG. 16, can be used.

Figure 17:
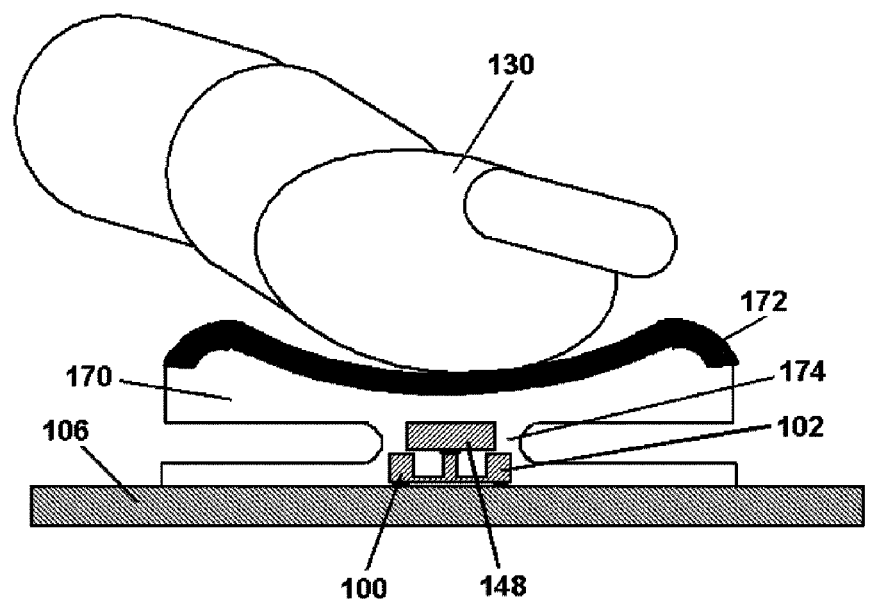
FIG. 17 shows an example of a flexing flat head finger force control device comprised of a rocking elastic plastic button directly coupled to a rigid force-transferring element which is coupled to a force sensor die and embedded in a layer of plastic which serves as an integrated button according to the ninth embodiment of the present invention.

For computer mouse applications at times there is no need for large deflections of a button as compared with joystick applications, but the height of the input control device is more important. For these applications, as illustrated in FIG. 17, the spring element providing required range of deflection and sensitivity can be made as a low profile rocking two vertebrae spine design according to a ninth embodiment. Here, the sensor die 100 with the rigid force-transferring element 148 are mounted on the substrate 106. The elastic plastic 170 covers all above elements and forms a flexible neck 174. The top surface of the button is covered with a hard layer of plastic 172 serving as a surface where an external force is applied. The force applied, for example by a finger 130, to the top hard layer 172 of the button rocks the button 170 creating the mechanical stress and deflection within the plastic in the neck area 174 between the sensor die 100 and the rigid force-transferring element 148. This stress is transferred to the sensor die and finally to the stress sensitive IC components.

Figure 18:
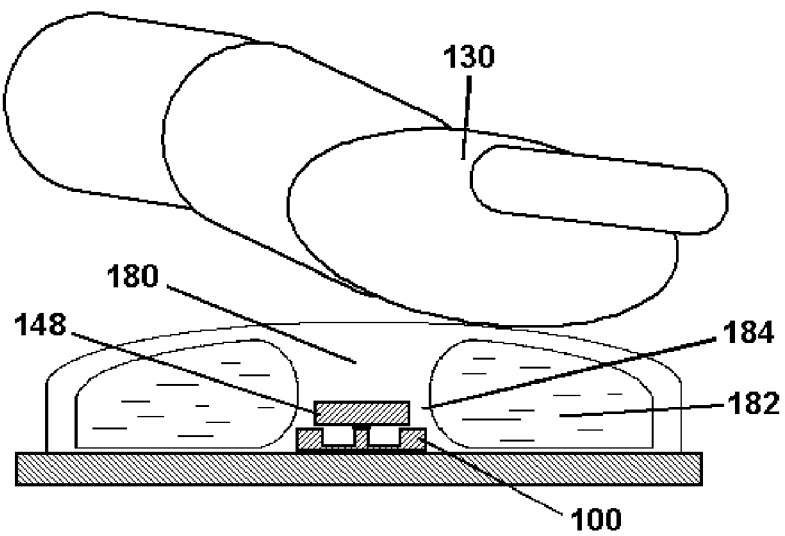
FIG. 18 shows an example of a flat head finger force control device comprised of an elastic plastic button filled with a liquid or gel and directly coupled to a force-transferring element which transfers the input or applied vector force to the force sensor die and where the force of the finger is transferred to the plastic and the sensor die through a liquid or gel according to the tenth embodiment of the present invention.
Figure 19:
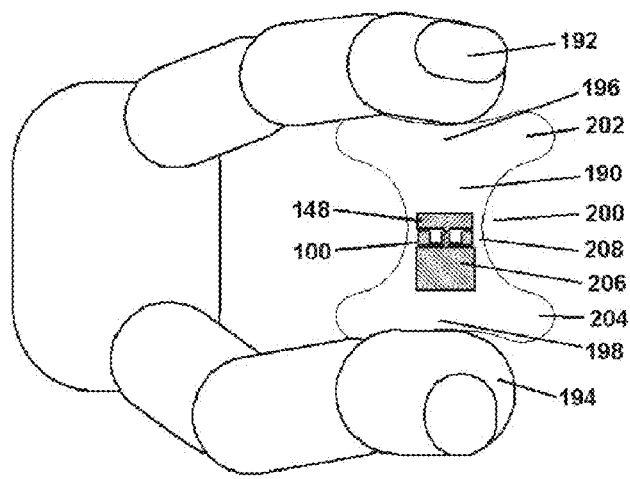
FIG. 19 shows an example of wireless finger force control device embodied in an elastic plastic package directly coupled to a rigid force-transferring element which is in turn coupled to a force sensor die and where the transmitter and a power supply are also encapsulated according to the eleventh embodiment of the present invention.

The spring element, as illustrated in FIG. 18, also can be made from the elastic plastic material filled with viscous liquid or gel according to tenth embodiment. Finger 130 applies the force to the plastic shell of the button 180. The inner cavities of the button are filled with liquid or gel 182. The central part of the elastic plastic button shell covers the sensor die 100 C. When the force is applied to a certain area of the button, then elastic shell deforms and creates an additional pressure in some of the cavities filled with liquid or gel. This pressure transfers through liquid or gel to a central portion of the shell to the area between the sensor die 100 and the rigid force-transferring element 148 transferring the finger force 130 to mechanical stress in the sensor and finally a combination of the output signals corresponding to three components of a force vector.

For some applications finger-mouse or micro-joystick input devices require IC devices for processing signals from the stress sensitive IC components. This circuitry can be integrated on the same chip or added to the input device as a separate but connected functional chip. In addition, where remote control functionality is required, wireless communication circuitry can also be added to the device, as it shown in FIG. 19, according to eleventh embodiment. Fingers 192 and 194 manipulate the wireless 3D input force control microdevice 190, the package exterior of which can be elastic plastic. The wireless input device button shape has lobe areas 202 and 204 and a neck portion 200. Fingers 192 194 contact the device in the surface areas 196 and 198. The sensor die 100 together with rigid force-transferring element 148 are located in the neck portion 200 of the device. In this wireless device design, the IC processing and wireless circuits are integrated at the sensor chip 100. A battery 206 is also encapsulated within the package. Fingers moving relative to each other creates mechanical stress in the neck portion of the wireless input device in the location 208 of the sensor die which are transferred to the rigid force-transferring element 148. From there this stress is transferred to the sensor die and stress sensitive IC components. The output signals from the sensitive components are processed by IC logic and in digital form are transmitted, as a RF signals, to a receiving controlled system. Wireless antenna and such associated technology are well known to those skilled in the art.

Figure 20:
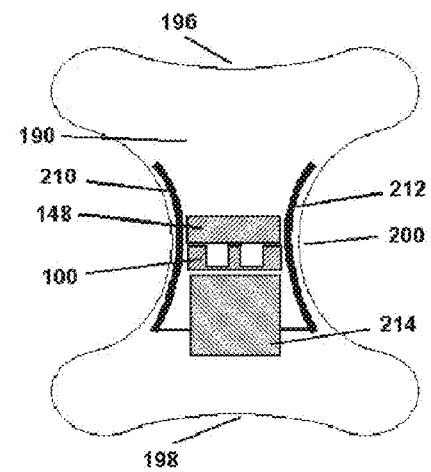
FIG. 20 shows an example of wireless battery less finger force control device based on an elastic plastic package directly connected to the rigid force-transferring element and to the force sensor die and where a transmitter, piezoelectric flexible elements and a capacitor for power storage are also encapsulated according to the twelfth embodiment of the present invention.

The battery, as a power supply, limits the lifetime of the control device if it is not interchangeable. The force controlled input device in principle consumes mechanical energy, as a result of the applied force and deflection. This mechanical energy, which is otherwise wasted as heat, can be used for power generation, as it is illustrated in FIG. 20 according to twelfth embodiment. The wireless 3D force controlled input device 190 besides sensor die 100 and rigid force-transferring element 148, also has piezoelectric elements 210 212 located in the neck area 200 and lobe onset of the device. Mechanical stress and deformation is developed in these areas and therefore, a good location for piezoelectric element(s) for power generation. These piezo elements can be connected to capacitors accumulating electrical charge generated through finger flexure or button deformation.

Figures 21A, 21B:
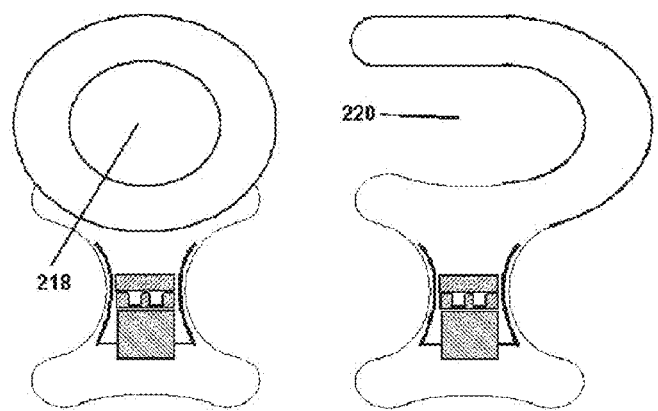
FIG. 21A shows an example of wireless battery less finger force control device constructions with different attachments to the one of the fingers according to the twelfth embodiment of the present invention.
FIG. 21B shows an example of wireless battery less finger force control device constructions with different attachments to the one of the fingers.

From a practical viewpoint it might not be convenient to hold the remote button. Also the button is small and easily lost. It might may add convenience if this button were attached to one of the fingers. As it is illustrated in FIGS. 21A-21B, a simple addition to the button of either a ring 218 or a thimble 220.

In some portable consumer devices it can be preferable or beneficial to make them smaller, lighter, less power consuming, etc., and/or combinations thereof. The size of a device may be limited by the desired size of a screen (or other display) and/or other components associated with the device. Often, one of the efforts in miniaturizing of these devices is focused on making them thinner and therefore typically lighter. In some portable gaming devices, which still often utilize a joystick, as an input control, the implementation of the joystick may impose specific parameters and/or requirements on joysticks. For example, it can be beneficial to have a low profile (e.g., thinner than the thickness of the body of portable device), while still providing relatively large deflection (e.g., in the range of several mm) in a plane of the device for better control of the input function. Millimeter range deflections is called "large" compared to microns range of deflections, which is typical for a rigid island of a sensor die, where an external force is finally transferred.

Therefore, the term "low profile" will be applied to such force input control devices (e.g., joysticks), which can be easily incorporated within portable devices without affecting (increasing) its thickness. Similarly, a thickness of such portable devices would not depend on the profile or thickness of a force input control device according to at least some embodiments.

The term "large deflection" will be applied to such force input control devices (e.g., joysticks), which can provide deflection of a button, where external force is applied, in millimeter range, which is three orders of magnitude larger than the deflection of the rigid island, to which the external force will be transferred.

This can be achieved by different specific solutions. However, some embodiments consider one or more features. First, in some embodiments an input, such as a button, may be slid generally along a plane of the device providing a relatively large displacement in the plane of the device. Second, one or more spring elements may be incorporated between the button and a force transferring element of the sensor die positioned relative to the button such that a percentage of an external force applied to the button is transferred to the force transferring element. Third, a spring element in some implementations can be thin and located parallel to the plane of the device.

Figure 22:
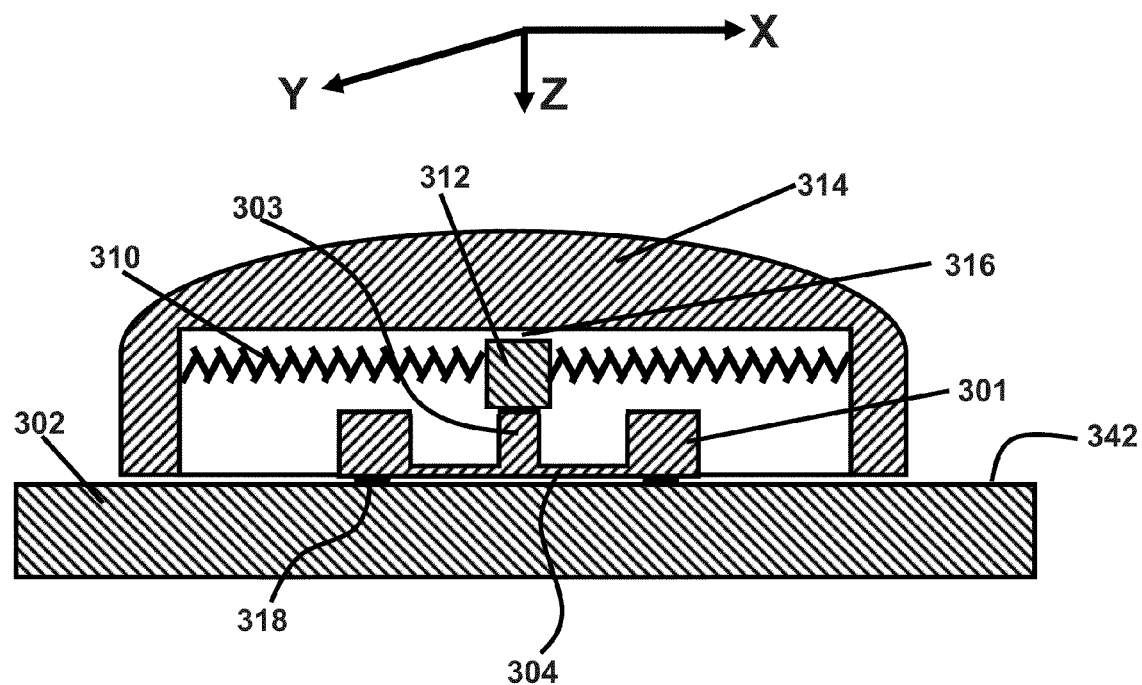
FIG. 22 shows examples of low profile force control device with the button coupled to a force transferring element of the sensor die by one or more spring elements located in a plane parallel to the plane of the substrate to provide a relatively small device thickness and a relatively large deflection of the sliding button.

FIG. 22 depicts a simplified, cross-sectional view of an input device or assembly, according to some embodiments, that can be incorporated into a device to receive input to the device, such as from a user applying an external force to the input device. It is illustrated in FIG. 22, where a sensor die 301 is coupled to a substrate 302 and has the rigid island 303. In some instances, a force transferring element 312 is further included and cooperated with an end of the rigid island 303 distant from the elastic element 304 of the sensor die 301. The button 314 is coupled to the force transferring element 312 by one or more biasing members or spring elements 310, which allow the button 314 to move or slide on the surface 342 of the substrate 302. A small gap 316 can be provided between an inner surface of the button 314 and the force transferring element 312 allowing the button to move in at least the X and Y directions parallel to the surface 342 of the substrate 302 without touching the force transferring element 312. The spring element 310, in some implementations, is configured to translate a deflection of the button 314 into an allowable force applied to the rigid island 303. Further, the spring element 310 may further provide a balance between a desired range of deflection of the button 314 and a force applied to the rigid island 303 to accurately sense the intended input based on the deflection of the rigid island. When relevant and/or needed, however, an external force (e.g., a user can press the button) can be applied in the Z direction perpendicular to the substrate surface 304 and due to flexibility of the top of the button touch the force transferring element 312. This mechanical signal is transferred to and through the rigid island 303 to the one or more sensitive components of the sensor die, where the sensitive components can generate an action signal corresponding to a Z direction of the force vector.

The spring element 310 is positioned to extend laterally from the force transferring element 312 and, in at least some implementations, generally parallel with the surface 342 of the substrate 302. Further, the spring element 310 can comprise a single structure or multiple structures (e.g., two or more spring elements extending radially away from the force transferring element 312 and toward side(s) of the external button 314).

The spring element 310, in at least some implementations, provides balance between achieving a desired range of the button displacements (in X and Y directions) and a force, that is to be applied to the rigid island 303, and to achieve the corresponding range of the applied force to the rigid island of the sensor die 301, which would provide the sufficient range of the output signals from the stress sensitive components for further processing, and in some embodiments representation on the full range of a screen or monitor of the consumer device.

From a designer of application view point, a range of desired displacement in an X direction can be a known parameter. The corresponding range of force necessary to be applied to the rigid island of a sensor die for providing a sufficient output signal from the sensor die is also known. Therefore, the spring constant k of a spring element is defined by Hooke's law:

$$F = k\,X,$$

where F is the external force equal to the exerted force by a spring; and X is a displacement of the button, when an external force is applied. Therefore, the specific structure of the spring element can have multiple solutions in accordance with variations in ratios of displacement to force.

Figure 23:
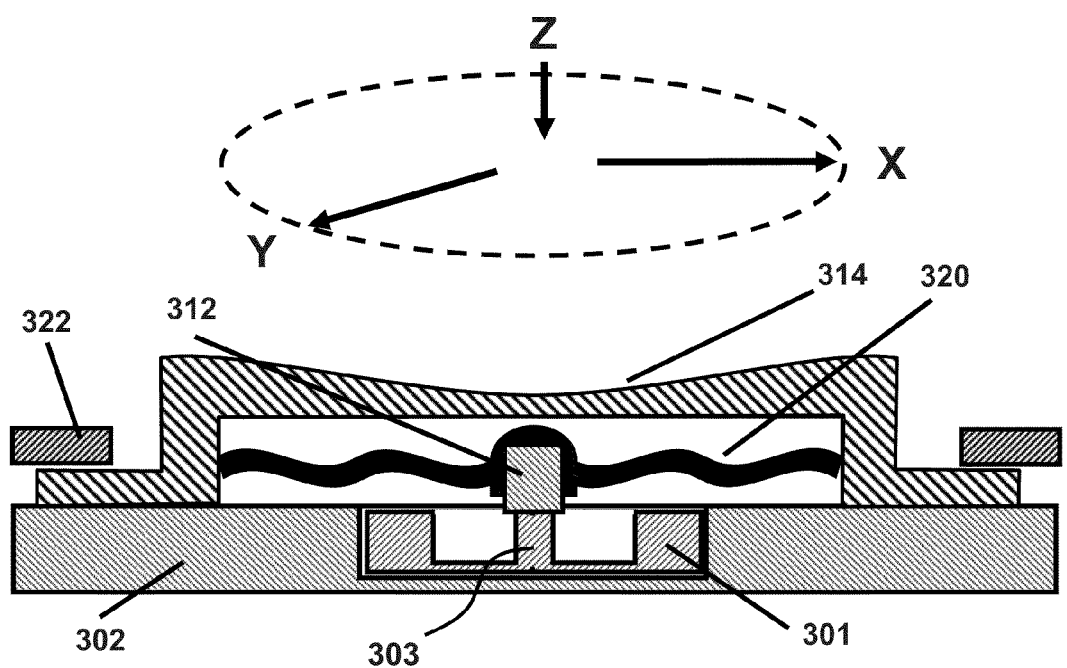
FIG. 23 shows examples of low profile finger force control device with the button coupled to a force transferring element of the sensor die by a corrugated flexible diaphragm providing a small thickness of the device and a large deflection of the button in the plane of the substrate.

FIG. 23 depicts a simplified cross-sectional view of an input assembly according to some embodiments and further illustrates a variation of the same principle of FIG. 22. In this embodiments, one or more biasing members or spring elements 320 is positioned relative to the rigid island 303 of the sensor die 301 and configured to provide a balance between a desired range of displacement of the button 314 and a force applied to the rigid island 303. In some implementations, the spring element 302 couples with a force transferring element 312 that is cooperated with the spring element 320. In some embodiments, the spring element 320 is configured as a corrugated flexible diaphragm 320. The button 314 is positioned relative to the sensor die 301 and the substrate 302 such that the button 314 is configured to slide between the substrate 302 and an additional limiting member 322 (e.g., plate, ledge, rim or the like), which provides limits in motion in all directions X, Y and Z. In FIG. 23, the spring element 320 is shown as a single element. It is noted, however, that in some embodiments, multiple spring elements 320 can be cooperated, including stacking multiple spring elements (e.g., stacking multiple diaphragms).

Figure 24:
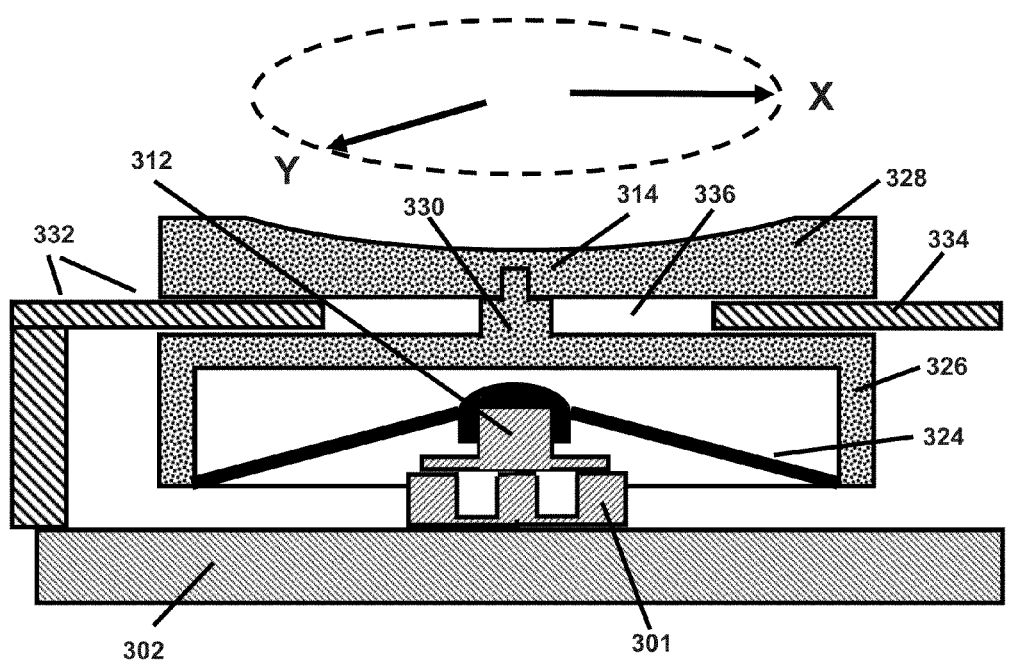
FIG. 24 shows examples of low profile finger force control device with the button coupled to a force transferring element of the sensor die by a diaphragm like structure providing a small thickness of the device and a large deflection of the button in the plane of the substrate.

FIG. 24 depicts a simplified cross-sectional view of an input device according to some embodiments and illustrates another variation of at least some of the principles illustrated above. The input device includes a sensor die 301 and a biasing member or spring element 324 cooperated with the sensor die 301. The spring element 324 could comprise, in some embodiments, a flexible (e.g., rubber like, plastic, etc.) pre-stretched diaphragm. The button 314 has two sections or in some instances two parts 326 and 328, which are separated by and/or coupled with a pin-spacer 330. The button 314 is slidable on the plate 332, 334 that partially extends in the space 336 between the two parts 326,328 of the button 314. This construction of the button has an advantage, in at least some implementations, with the previous examples in that it is not sliding on the substrate 302, where area around the sensor die 301 can be occupied by other devices, components or the like, such as other electronic components (not shown). The button 314 in this embodiment is positioned above and/or floating above those components. This can save space on the substrate 302, and in some instances can simplify assembling and disassembling of the device.

Figure 25:
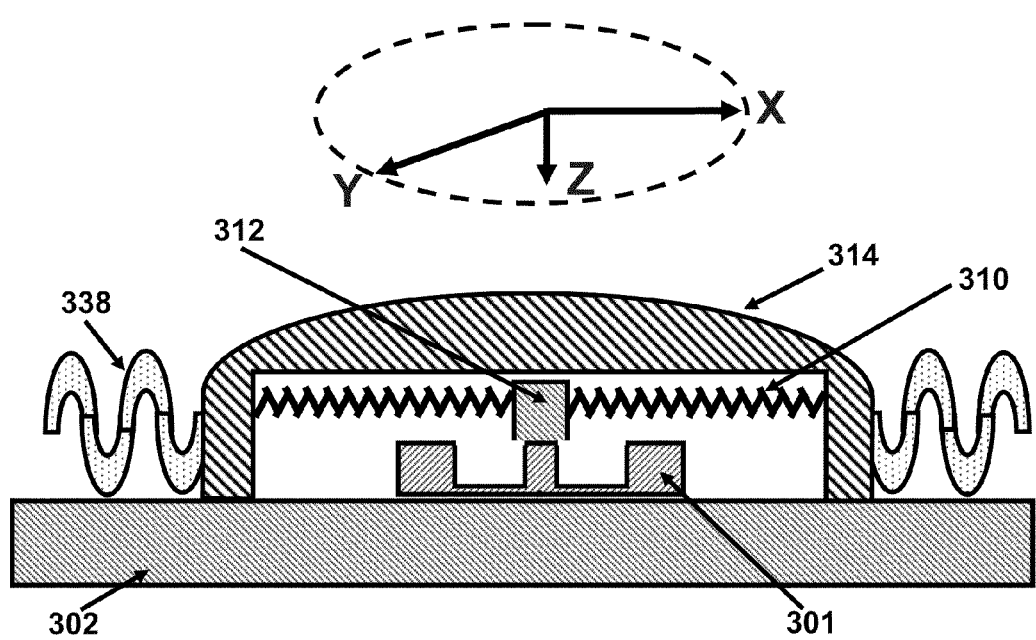
FIG. 25 shows examples of low profile finger force control device with the button coupled to a force transferring element of the sensor die by one or more spring elements and having one or more additional spring elements coupled to the outside of the button.

FIG. 25 shows a simplified cross-sectional view of an input device according to some embodiments. In some embodiments, a spring constant of the internal spring element 310 coupling the button 314 and the force transferring element 312 may not be high enough to withstand the resistance of a user's finger moving the button. In some embodiments, one or more external biasing members and/or spring elements 338 can be added to the device, as shown in FIG. 25. Compared to the applications shown in FIGS. 23 and 24, the external spring element 338 provides, in some embodiments, an additional protection of an inner space of the consumer device in which the force input control device is incorporated from dust and mechanical particles. Additionally or alternatively, the external spring element 338, in some embodiments, provides mechanical damping relative to when the button 314 approaches and/or contacts one or more mechanical stops in any directions within X and/or Y movements. The external spring element 338 can be implemented through numerous different configurations, including configurations similar to those described relative to the internal spring element 310, or other configurations and/or shapes. For example, in some instances, the external spring element 338 may be implemented through a flexible corrugated diaphragm.

Figure 26:
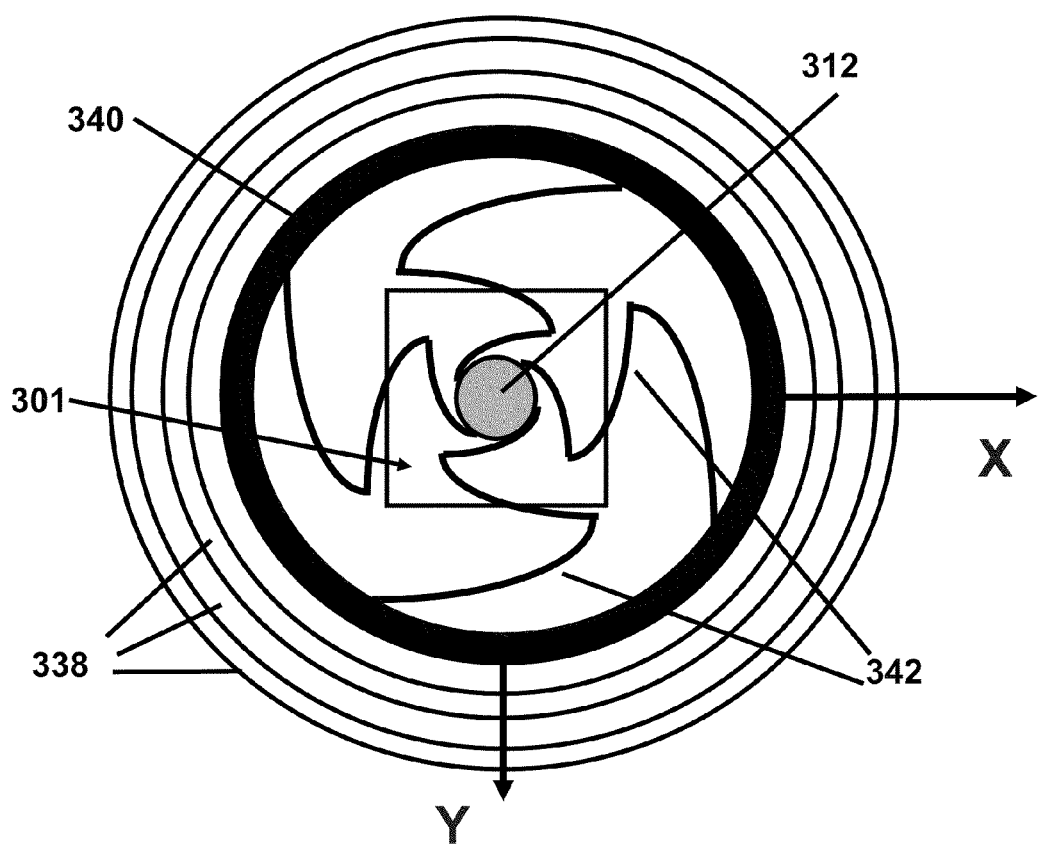
FIG. 26 shows a top view of low profile finger force control device with the button coupled to a force transferring element of the sensor die by one or more biasing or spring elements, such as one or more zigzag springs.

The internal spring element 310 and external spring element 338 might have a different shape. For example, the internal spring element can, in some instances, be in the form of several flat zigzag springs 342, as shown in FIG. 26, which schematically illustrate the planar view of an input device according to some embodiments, such as a sliding joystick. The body of the button 340 is coupled to the force transferring element 312, in the embodiment of FIG. 26, by four zigzag spring elements 342. The external peripheral side of the button body is coupled to the external spring 338. When the button 340 is moved in X and Y directions, springs 342 transfer motion and force to the force transferring element 312 of the sensor die 301 and further to the sensitive components of the sensor die, which generate an output signals proportional to the vector components of the applied force.

Figure 27:
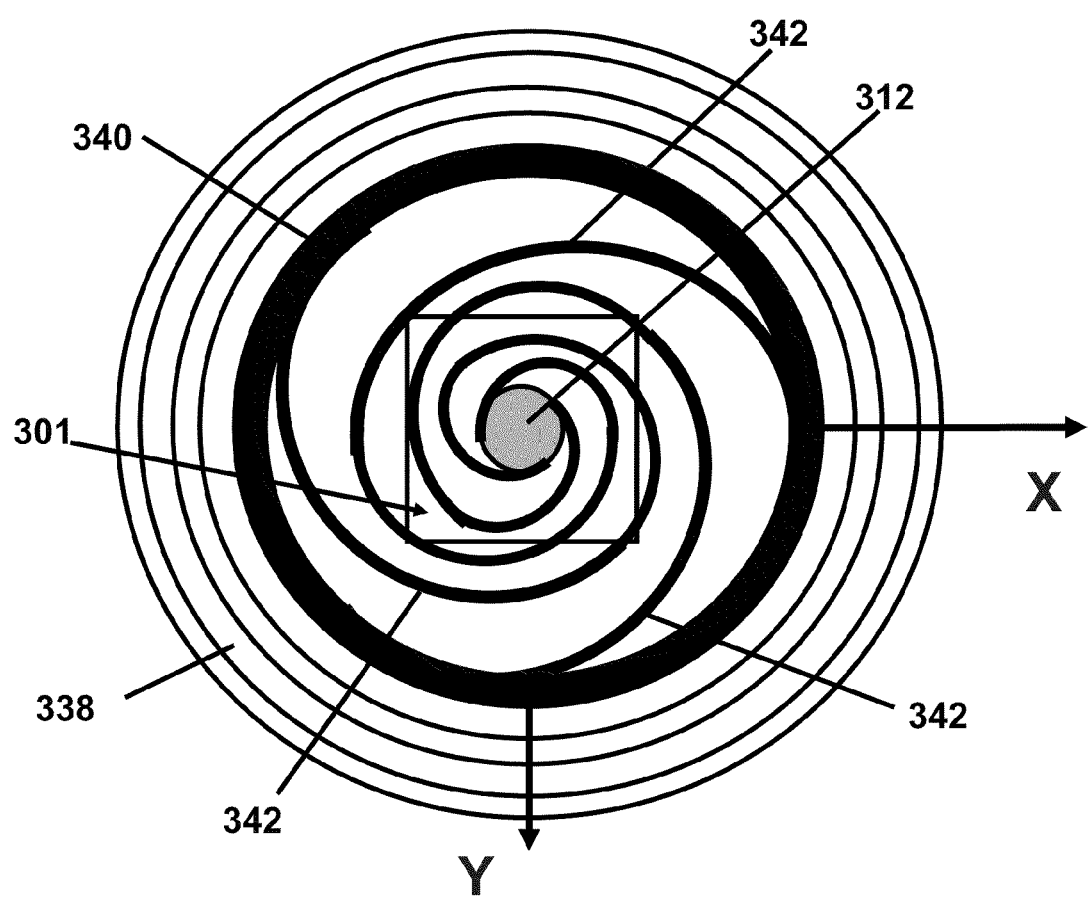
FIG. 27 shows a top view of low profile finger force control device with the button coupled to a force transferring element of the sensor die by one or more spiral springs.

FIG. 27 illustrates a variation of the planar view of the input device (e.g., sliding joystick) according to some embodiments, where the internal spring element is made as a combination of a plurality of spiral springs 342. In general, the exterior and/or interior spring elements can have at least one element chosen from a group of: rubber-like flat diaphragm, corrugated diaphragm, spiral spring, flat zigzag spring, cylinder spring, rubber-like strings, or other such biasing members or combinations of the above. Any thin elastic structural element allowing relatively large displacement in the plane of the substrate surface and having required spring constant for transferring force vector components to the sensor die can be used for this application.

Figure 28:
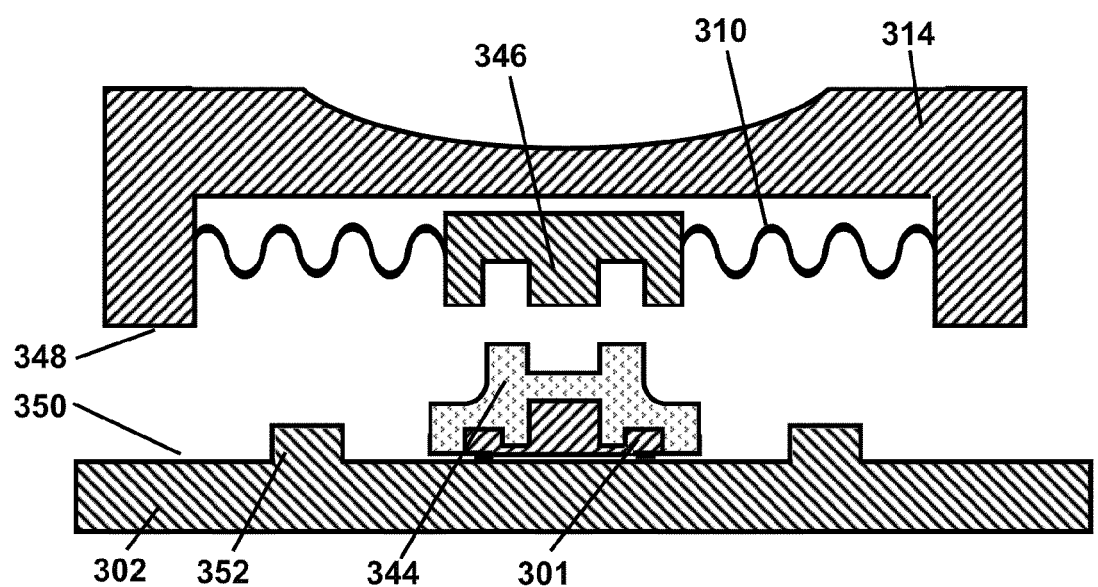
FIG. 28 shows an example of coupling between the button and the sensor die.

FIG. 28 shows a cross-sectional view of an input device illustrating another approach to connection of the force transferring element 346 with the sensor die 301 according to some embodiments. The force transferring element 346 is assembled within an interior area of the button 314 and coupled to the body of the button by the spring element 310. The sensor die 301 is mounted on the substrate 302 and is covered by a body 344 (e.g., a plastic, rubber, etc.), which shape fits and/or corresponds with the shape of the corresponding parts of the force transferring element 346. This construction similar to that described in FIG. 24 also can simplify assembling and disassembling of the device.

Figure 29:
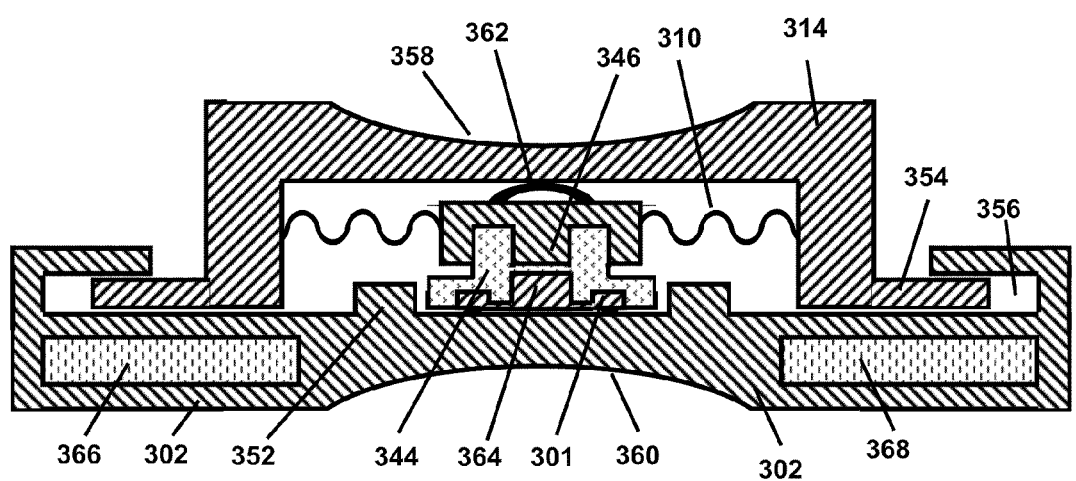
FIG. 29 shows an example of wireless sliding universal remote control device or wireless sliding micro-joystick, which can be, for example, held between fingers sliding relative to each other.

FIG. 29 illustrates an example of the wireless sliding micro-joystick according to some embodiments, which can be used for any number of applications, such as but not limited to a universal remote control device for different applications. The body of the device has two major parts: substrate or base part 302 and sliding button 314. The base part 302 includes and/or is cooperated with a power supply 366, electronic circuitry including wireless communication 368, a sensor die 301, a sliding slot 356 and mechanical stops 352 limiting the motion of the button 314. The sliding button 314 contains a spring element 310 coupling the body of the button to the force transferring element 346, a shell spring element 362 for a tactile feedback of the action function and a sliding guide 354 allowing button to slide in X and Y directions and protecting the inner space of the device from dust and mechanical particles. The force transferring element 346 is coupled to the rigid island 364 sensor die with a plastic body 344.

When, for example, a thumb and a one of the fingers are applied to the cavities 358 and 360 on the button 314 and the base 302 of the device, and the thumb and finger start sliding with respect to each other in one or two dimensions (X and/or Y), the mutual displacement of the button and the base creates a vector force applied through the spring element 310, and force transferring element 344 to the sensor die 301. The one or more sensitive components on the sensor die 301 generate electrical signals proportional to the vector components of the applied force. These electrical signals are digitized, processed and wirelessly transmitted to a receiving electronic device, e.g. TV-set, gaming device, computer, etc. For example, the movement of the button 314 in the X and/or Y direction can allow a user to choose, highlight or select a desired function at the receiving device (e.g., as displayed on a monitor of the receiving device). When a requested function has been highlighted or chosen, then the button 314 can be pressed between the finger and thumb (Z direction) and the desired action function could be activated. In some implementations, the shell spring 362, when included, would click and would send a tactile feedback to the finger that the threshold pressure was achieved for executing the selected function.

The size and the shape of such remote control device are limited only by available components and by the fantasy of the designer. This is only an illustration of such remote control device.

Some embodiments provide methods and/or devices for one or more dimensional input control of different functions in electronic devices is provided. Certain versions of the Present Invention provide a one or more dimensional input force interface control device for cell phones, portable gamers, digital cameras, and other applications. Certain alternate versions of the Present Invention exhibit one or more of the qualities of smallness, low-cost, high reliability, and/or high stability. Certain still alternate versions of the Present Invention provide a three, two or one-dimensional input finger force control device that (1.) accommodates a required ratio between X, Y and Z sensitivities, (2.) has low cross-axis sensitivity, (3.) allows process integration with other sensors and CMOS, (4.) is scalable, (5.) allows convenient solutions for applying an external force, and/or (6.) allows economic manufacturability for high volume consumer markets.

It should be understood that the microstructures of the die, structures of the finger-mice, finger buttons and micro-joysticks do not limit the present invention, but only illustrate some of the various technical solutions covered by this invention. While the invention has been described in detail with reference to preferred embodiments, it is understood that variations and modifications thereof may be made without departing from the true spirit and scope of the invention.

What is claimed is:

1. A force input control device for sensing vector forces and converting them into electronic signals for processing on a substrate comprising:
   a sensor die comprising: a rigid island, an elastic element coupled to the rigid island, die frame coupled to a periphery of the elastic element, one or more stress sensitive components on the elastic element, and signal processing IC, where the sensor die is sensitive to a magnitude and a direction of a force applied to the rigid island within the sensor die,
   where the sensor die is coupled electrically and mechanically to a substrate,
   a spring element coupling an external button, where the force is applied, to the rigid island element,
   wherein the spring element has a flat geometry and located in a plane parallel to a plane of the substrate, where the spring element is configured to translate a deflection of the button into an allowable force applied to the rigid island.

2. The force input control device for sensing vector forces as in claim 1, further comprising an additional rigid force-transferring element coupled to the rigid island and the spring element and providing a bigger surface area than the rigid island and with which spring element couples, and where the rigid force-transferring element is configured to provide protection of the elastic element from a side of the rigid island.

3. The force input control device for sensing vector forces as in claim 1, wherein the spring element comprises at least one element chosen from a group of: rubber-like flat diaphragm, corrugated diaphragm, spiral spring, flat zigzag spring, cylinder spring, rubber-like strings, and combination of the above.

4. The force input control device for sensing vector forces as in claim 1, wherein the button is cooperated relative to the substrate and configured to slide in a plane parallel to the substrate.

5. The force input control device for sensing vector forces as in claim 1, wherein the rigid island, the elastic element, the die frame, the one or more stress sensitive components, and the signal processing IC of the sensor die are formed within single semiconductor substrate.

6. The force input control device for sensing vector forces as in claim 1, wherein a height of the rigid island is greater than a difference between a thickness of the die frame and a thickness of the elastic element.

7. The force input control device for sensing vector forces as in claim 1, wherein the sensor die comprises at least two stress sensitive components on the elastic element.

8. The force input control device for sensing vector forces as in claim 1, wherein the sensor die comprises at least three stress sensitive components on the elastic element.

9. The force input control device for sensing vector forces as in claim 1, wherein the at least one stress sensitive component is selected from the group of stress sensitive components consisting of: piezoresistor, pn-junction, tunnel diode, Schottky diode, shear stress component, piezoresistive Wheatstone bridge, MOS transistor, complementary pair of CMOS transistors, bipolar transistor, pair of p-n-p and n-p-n bipolar transistors, bipolar transistor and at least one piezoresistor connected to transistor, MOS transistor and at least one piezoresistor connected to transistor, bipolar transistor circuit, and CMOS transistor circuit or combination.

10. The force input control device for sensing vector forces as in claim 1, wherein the elastic element has annular or n-sided polygon geometry with thickness smaller than a thickness of the die frame adjacent the elastic element.

11. The force input control device for sensing vector forces as in claim 1, wherein the elastic element comprises at least one penetration extending through a thickness dimension of the elastic element, where the thickness dimension is perpendicular to a surface of the elastic element.

12. The force input control device for sensing vector forces as in claim 1, wherein the rigid island element is formed in a shape selected from a group of shapes consisting of cone, cylinder, semi-sphere, sphere, faceted cone, faceted cylinder, faceted semi-sphere, faceted sphere and combinations.

13. The force input control device for sensing vector forces as in claim 1, wherein the rigid island element comprises at least one non-uniformity selected from a group of non-uniformities consisting of cavity, trench, hole, mesa, ridge, bridge, cantilever, area of negative slope and combinations.

14. The force input control device for sensing vector forces as in claim 1, wherein the signal processing IC comprise circuitry configured to provide functions selected from a group of functions consisting of analog signal amplification, analog-to-digital and digital-to-analog conversion, multiplexing, signal processing, gate logic, memory, digital interface, power management, encryption, compression and decompression, mixed signal processing, transmitting and receiving wireless signals, sensing various physical domains other than force and combinations.

15. The force input control device for sensing vector forces as in claim 1, further comprising: a rigid force transferring element connected to the rigid island; and a shell spring element configured to provide mechanical feedback allowing sensing of a click in response to pressure applied to the button in excess of a threshold detectable by at least one of the one or more stress sensitive components that are configured to generate a corresponding signal.

16. The force input control device for sensing vector forces as in claim 1, further comprising a force transferring element connected to the rigid island and having at least one additional microstructure element from the group of cavities, trenches, bumps or ridges for better adhesion with an additional force-transferring element, and where the force transferring element is further configured to provide protection of the elastic element and for additional mechanical overload protection.

17. The force input control device for sensing vector forces as in claim 1, further comprising one or more stops positioned relative to the substrate and the external button, where the one or more stops are configured to limit a range of a sliding motion of the external button.

18. The force input control device for sensing vector forces as in claim 1, where the button and spring element are positioned separate from a surface of the substrate upon which the sensor die is mounted.

19. The force input control device for sensing vector forces as in claim 17, wherein the one or more stops are located beneath the button, which allows to save area on a working panel of a consumer device into which the force input control device is incorporated.

20. The force input control device for sensing vector forces as in claim 1, further comprising:
   a base part comprising: a wireless communication circuit, a sliding slot and one or more mechanical stops;
   the spring element coupling a body of the button to a force transferring element coupled to the rigid island; and
   a shell spring element configured to provide a tactile feedback of an action function;
   where the button comprises a sliding guide configured to cooperate with the sliding slot such that the button is configured to slide in X and Y directions that are generally parallel with a surface of the elastic element, and whereby the sliding guide is further configured to protect the sensor die from dust and mechanical particles;
   wherein the base part and the button are assembled together in such a way that the button is slidably movable relative to the base part in the X and Y directions.

* * * * *